(12) United States Patent
Park et al.

(10) Patent No.: US 9,515,096 B2
(45) Date of Patent: Dec. 6, 2016

(54) THIN FILM TRANSISTOR ARRAY PANEL

(71) Applicant: Samsung Display Co., Ltd., Yongin, Gyeonggi-Do (KR)

(72) Inventors: Jeong Min Park, Seoul (KR); Ji-Hyun Kim, Seoul (KR); Jung-Soo Lee, Seoul (KR); Sung Kyun Park, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/838,055

(22) Filed: Aug. 27, 2015

(65) Prior Publication Data

US 2015/0364497 A1      Dec. 17, 2015

Related U.S. Application Data

(63) Continuation of application No. 14/090,487, filed on Nov. 26, 2013, now Pat. No. 9,123,873.

(30) Foreign Application Priority Data

Jan. 10, 2013   (KR) .................. 10-2013-0002982

(51) Int. Cl.
*H01L 27/12*     (2006.01)
*H01L 33/58*     (2010.01)
*G02F 1/1345*    (2006.01)
*G02F 1/1362*    (2006.01)
(Continued)

(52) U.S. Cl.
CPC .......... *H01L 27/124* (2013.01); *G02F 1/1368* (2013.01); *G02F 1/13458* (2013.01); *G02F 1/136227* (2013.01); *H01L 27/1248* (2013.01); *H01L 29/78669* (2013.01); *H01L 29/78678* (2013.01); *H01L 33/58* (2013.01)

(58) Field of Classification Search
CPC ................................. H01L 21/76805
USPC .............................. 257/88; 438/29
See application file for complete search history.

(56) References Cited

U.S. PATENT DOCUMENTS 6,448,113 B2   9/2002   Lee et al.
7,439,163 B2   10/2008  Hu et al.
7,615,866 B2   11/2009  Wang et al.
(Continued)

FOREIGN PATENT DOCUMENTS

JP   10-2010-060590      3/2010
KR   10-2001-0063295 A   7/2001
(Continued)

OTHER PUBLICATIONS

EP 13192014.2-1904/2755082:EESR, Jul. 28, 2014.

*Primary Examiner* — Dung Le
(74) *Attorney, Agent, or Firm* — Innovation Counsel LLP

(57) ABSTRACT

The present disclosure provides a thin film transistor array. In an exemplary embodiment, the thin film transistor array includes: a substrate; a gate line including a gate pad and disposed on the substrate; a gate insulating layer disposed on the gate line and the gate pad; a data line including a data pad and disposed on the gate insulating layer; a first passivation layer disposed on the data line; a first electrode disposed on the first passivation layer; a second passivation layer disposed on the first electrode; and a second electrode disposed on the second passivation layer. The gate pad is exposed through a first contact hole, and the gate insulating layer, the first passivation layer, and the second passivation layer include at least a portion of the first contact hole.

17 Claims, 36 Drawing Sheets

(51) Int. Cl.
*G02F 1/1368* (2006.01)
*H01L 29/786* (2006.01)

(56) References Cited

U.S. PATENT DOCUMENTS

| | | |
|---|---|---|
| 2001/0015778 A1 | 8/2001 | Murade et al. |
| 2001/0026344 A1 | 10/2001 | Sakamoto |
| 2002/0101557 A1 | 8/2002 | Ono et al. |
| 2008/0036044 A1 | 2/2008 | Sakuma et al. |
| 2009/0130841 A1 | 5/2009 | Cho et al. |
| 2013/0038808 A1* | 2/2013 | Song ................ G02F 1/133707 349/43 |
| 2013/0075736 A1 | 3/2013 | Kim et al. |
| 2013/0140570 A1 | 6/2013 | Kang et al. |
| 2013/0208206 A1* | 8/2013 | Park ................ H01L 29/41733 349/46 |
| 2013/0214299 A1 | 8/2013 | Ryu et al. |

FOREIGN PATENT DOCUMENTS

| | | |
|---|---|---|
| KR | 10-2007-0079350 A | 8/2007 |
| KR | 10-2009-0013490 A | 2/2009 |
| KR | 10-0972554 | 7/2010 |
| KR | 10-1144706 | 5/2012 |
| KR | 10-2013-0011856 A | 1/2013 |

* cited by examiner

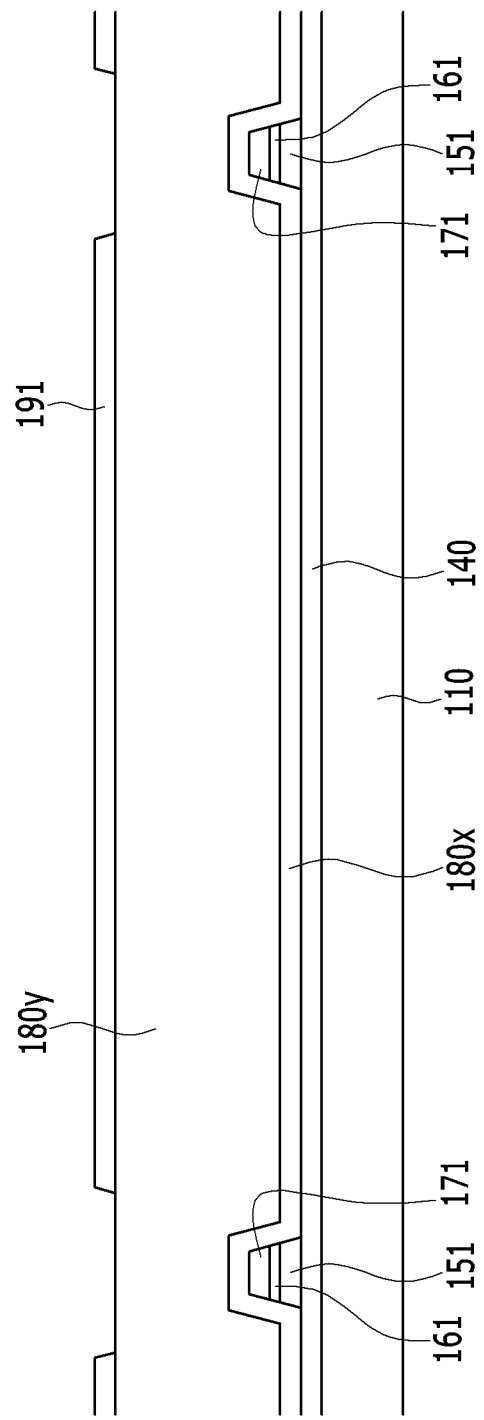

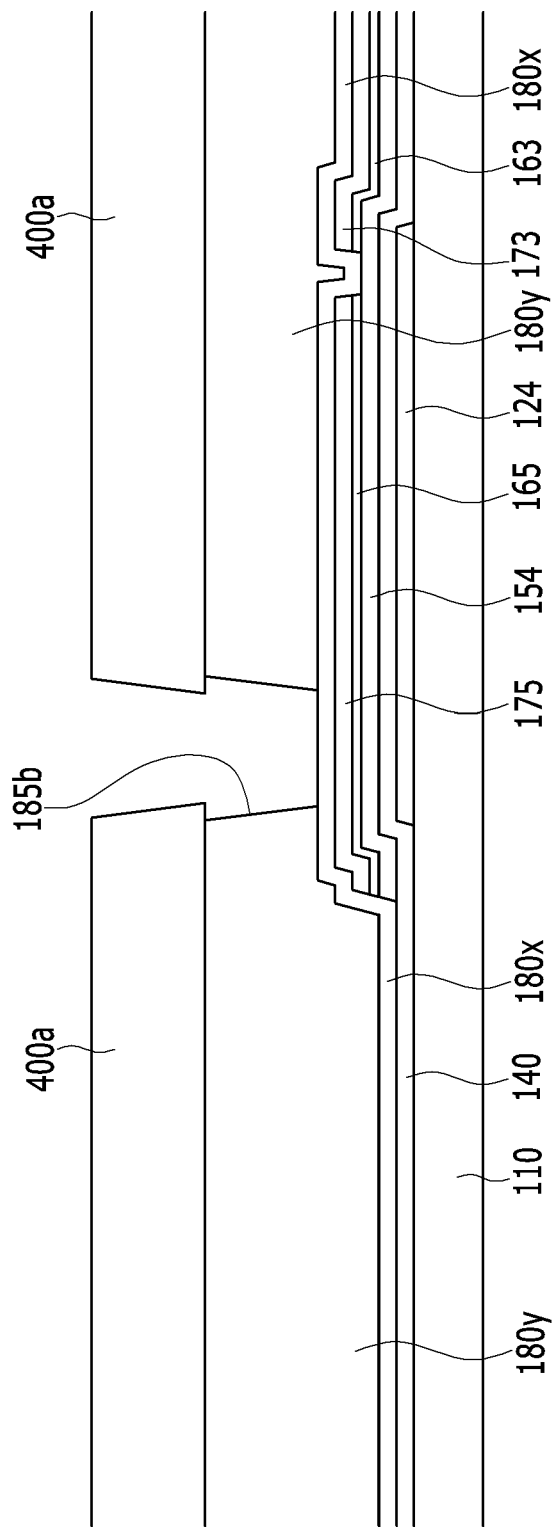

THIN FILM TRANSISTOR ARRAY PANEL

CROSS-REFERENCE TO RELATED APPLICATION

This application is a continuation application of U.S. patent application Ser. No. 14/090,487 filed on Nov. 26, 2013 and issued as U.S. Pat. No. 9,123,873 on Sep. 1, 2015, which claims priority to Korean Patent Application No. 10-2013-0002982 filed on Jan. 10, 2013 in the Korean Intellectual Property Office (KIPO), and all the benefits accruing therefrom under 35 U.S.C. §119. The entire contents of the above-listed applications are incorporated herein by reference.

BACKGROUND (a) Technical Field

The present disclosure of invention relates to a thin film transistor array panel and a manufacturing method thereof.

(b) Description of Related Technology

Liquid crystal displays are now widely used as a type of thin panel display (e.g., flat panel or curved panel). A typical liquid crystal display (LCD) has two spaced apart panels on which electric field generating electrodes are disposed, such as pixel electrodes on one panel and a common electrode disposed on the other. A liquid crystal material layer is interposed between the panels. The liquid crystal display is driven to apply voltages across the field generating electrodes so as to generate corresponding electric fields which extend into or through the liquid crystal layer. These then determine the alignment of liquid crystal molecules of the liquid crystal layer and thus a polarization effect applied to passing through light, thereby forming an image for display to a user who perceives the field modulated light.

Among the different kinds of liquid crystal displays, there is one class where the opposed field generating electrodes that generate the electric field of the liquid crystal layer are formed on a same thin film transistor array panel.

When the two field generating electrodes are formed on the thin film transistor array panel, a relatively large number of insulating layers are typically disposed between the thin film transistor and the field generating electrodes. When contact holes are formed for electrically connecting the thin film transistors to respective ones of the field generating electrodes, the contact hole typically extends through the relatively large number of insulating layers, and as a consequence the width of the contact holes become larger due to the process of etching through so many insulating layers and in particular, due to etching through a plurality of relatively hard insulating layers.

When the widths of the contact holes becomes enlarged in this way, they take away from the finite surface area allotted to each pixel unit and an aperture ratio of the liquid crystal display that uses the thin film transistor array panel is thereby deteriorated.

Meanwhile, when forming a drain contact hole in a region where a gate wire and a drain electrode are both present, in the case of etching through the gate insulating layer and through the passivation layer together, when the formed drain contact hole partially overlaps the gate wire of a corresponding thin film transistor (TFT), a short of the drain electrode and the gate wire may be generated, thereby causing a circuit defect.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

The present disclosure of invention provides a thin film transistor array panel for use in a display device and a manufacturing method thereof which provides for reduced width of contact holes in the display area (DA) as compared to widths of counterpart contact holes formed in the peripheral area (PA). More specifically, instead of forming contact holes the same way in both the non-image forming peripheral area (PA) and the image forming display area (DA) of the thin film transistor array panel, contact holes in the DA are formed by etching through a smaller number of insulating layers so that the holes of the DA are substantially smaller than those in the PA, where the latter contact holes are formed by etching through a greater number of insulating layer. The reduced size of contact hole in the DA improves an aperture ratio of the corresponding display device.

A thin film transistor array according to an exemplary embodiment includes: a substrate; a gate line including a gate pad and disposed on the substrate; a gate insulating layer disposed on the gate line and the gate pad; a data line including a data pad and disposed on the gate insulating layer; a first passivation layer disposed on the data line; a first electrode disposed on the first passivation layer; a second passivation layer disposed on the first electrode; and a second electrode disposed on the second passivation layer, wherein the gate pad is exposed through a first contact hole, and wherein the gate insulating layer, the first passivation layer, and the second passivation layer include at least a portion of the first contact hole.

The first contact hole may extend through the gate insulating layer, the first passivation layer, and the second passivation layer.

The thin film transistor array may further include an organic layer disposed between the first passivation layer and the second passivation layer, wherein the substrate has a display area displaying images and a peripheral area disposed near the display area, and wherein the organic layer is disposed in the display area and is not disposed in the peripheral area.

The thin film transistor array may further include a drain electrode disposed on the gate insulating layer and connected to one of the first electrode and the second electrode through a second contact hole, wherein the organic layer and the first passivation layer include at least a portion of the second contact hole.

The second contact hole may overlap a portion of the gate line not overlapping the drain electrode, wherein the portion of the gate line overlapping the second contact hole may be covered by the gate insulating layer.

The first passivation layer and the second passivation layer may include at least a portion of a third contact hole exposing the data pad.

The thin film transistor array may further include an organic layer disposed between the first passivation layer and the second passivation layer, wherein the substrate has a display area displaying images and a peripheral area disposed near the display area, wherein the organic layer is disposed in the display area and the peripheral area, and wherein the thickness of a portion of the organic layer disposed in the peripheral area is thinner than the thickness of a portion of the organic layer disposed in the display area.

The thin film transistor array may further include a drain electrode disposed on the gate insulating layer and connected to one of the first electrode and the second electrode through a second contact hole, wherein the organic layer and the first passivation layer include at least a portion of the second contact hole.

The second contact hole may overlap a portion of the gate line not overlapping the drain electrode, wherein the portion of the gate line overlapping the second contact hole is covered by the gate insulating layer.

A thin film transistor array panel according to another exemplary embodiment includes: a substrate; a gate line including a gate pad and disposed on the substrate; a gate insulating layer disposed on the gate line and the gate pad; a data line including a data pad and a drain electrode, the data pad and the drain electrode disposed on the gate insulating layer; a first passivation layer disposed on the data line; a first electrode disposed on the first passivation layer; a second passivation layer disposed on the first electrode; and a second electrode disposed on the second passivation layer, wherein the gate pad is exposed through a first contact hole, and wherein the first contact hole extends through the gate insulating layer, the first passivation layer, and the second passivation layer.

The drain electrode may be connected to one of the first electrode and the second electrode through a second contact hole, wherein the second contact hole overlaps a portion of the gate line not overlapping the drain electrode, and wherein the portion of the gate line overlapping the second contact hole is covered by the gate insulating layer.

The thin film transistor array may further include an organic layer disposed between the first passivation layer and the second passivation layer, wherein the substrate has a display area displaying images and a peripheral area disposed near the display area, wherein the organic layer is disposed in the display area, and wherein the organic layer and the first passivation layer include at least a portion of the second contact hole.

The first passivation layer and the second passivation layer may include at least a portion of a third contact hole exposing the data pad.

A thin film transistor array panel according to another exemplary embodiment includes: a substrate; a gate line including a gate pad and disposed on the substrate; a gate insulating layer disposed on the gate line and the gate pad; a data line including a data pad and a drain electrode, the data pad and the drain electrode disposed on the gate insulating layer; a first passivation layer disposed on the data line; a first electrode disposed on the first passivation layer; a second passivation layer disposed on the first electrode; and a second electrode disposed on the second passivation layer, wherein the drain electrode is exposed through a first contact hole, and wherein the first contact hole overlaps a portion of the gate line not overlapping the drain electrode, and wherein a portion of the gate line overlapping the first contact hole is covered by the gate insulating layer.

The thin film transistor array may further include an organic layer disposed between the first passivation layer and the second passivation layer, wherein the substrate has a display area displaying images and a peripheral area disposed near the display area, wherein the organic layer is disposed in the display area, and wherein the organic layer and the first passivation layer include at least a portion of the first contact hole.

The gate pad may be exposed through a second contact hole, wherein the gate insulating layer, the first passivation layer, and the second passivation layer include at least a portion of the second contact hole, and wherein the first passivation layer and the second passivation layer include at least a portion of a third contact hole exposing the data pad.

In the thin film transistor array according to an exemplary embodiment, the gate insulating layer is not etched through where contact holes are formed in the display area. Instead, only the first passivation layer that is positioned between the drain electrode and the field generating electrode is etched among the formed insulating layers of the display area, and after forming the first contact hole to connect the field generating electrode and the drain electrode of the thin film transistor, in the peripheral area, the insulating layers such as the gate insulating layer, the first passivation layer, and the second passivation layer positioned on the gate wire and the data wire are simultaneously etched to form the second contact hole and the third contact hole exposing the gate pad and the data pad, thereby preventing the expansion of the width of the first contact hole formed in the display area.

Also, according to an exemplary embodiment, when forming the first contact hole and the first electrode in the display area, the gate insulating layer is not etched, even though the first contact hole overlaps at least a portion of the gate wire, the gate insulating layer is positioned on the gate wire, thereby preventing the short between the drain electrode and the gate wire when the material of the first electrode is deposited into the first contact hole.

BRIEF DESCRIPTION OF THE DRAWINGS

FIGS. 13, 14, 15, 16, 17, 18, 19, and 20 are cross-sectional views partially showing a manufacturing method of a thin film transistor array panel according to an exemplary embodiment, taken along the lines II-II, III-III, IV-IV, and V-V of FIG. 1.

FIGS. 25A, 25B, and 25C are cross-sectional views sequentially showing a part of a manufacturing method of a thin film transistor array panel according to another exemplary embodiment, taken along the line III-III of FIG. 1.

DETAILED DESCRIPTION

Figure 1:
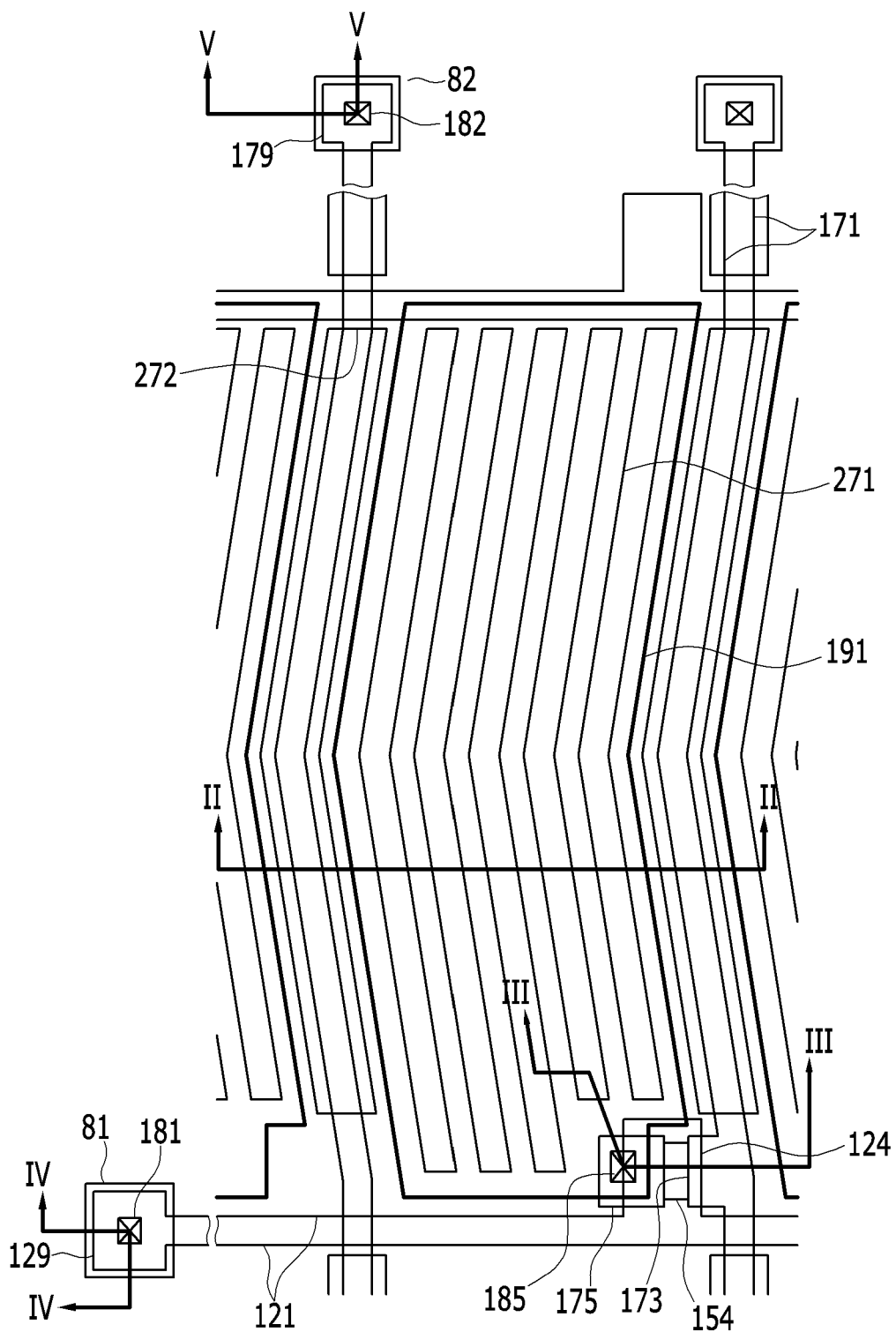
FIG. 1 is a top plan layout view of a thin film transistor array panel according to an exemplary embodiment of the present disclosure of invention.

The present disclosure of invention will be described more fully hereinafter with reference to the accompanying drawings, in which exemplary embodiments are shown. As those skilled in the art would realize after appreciating this disclosure, the described embodiments may be modified in various different ways, all without departing from the spirit or scope of the present teachings.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, with reference to drawings, exemplary embodiments will be described.

Figure 2:
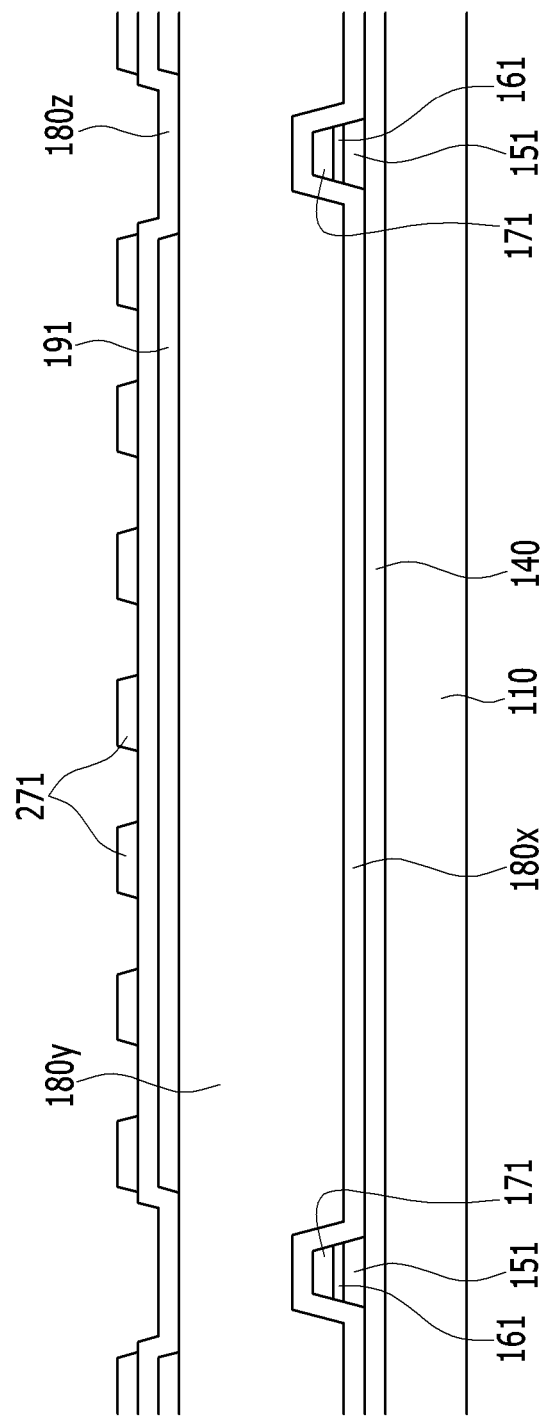
FIG. 2 is a cross-sectional view of the thin film transistor array panel of FIG. 1 taken along line II-II.
Figure 3:
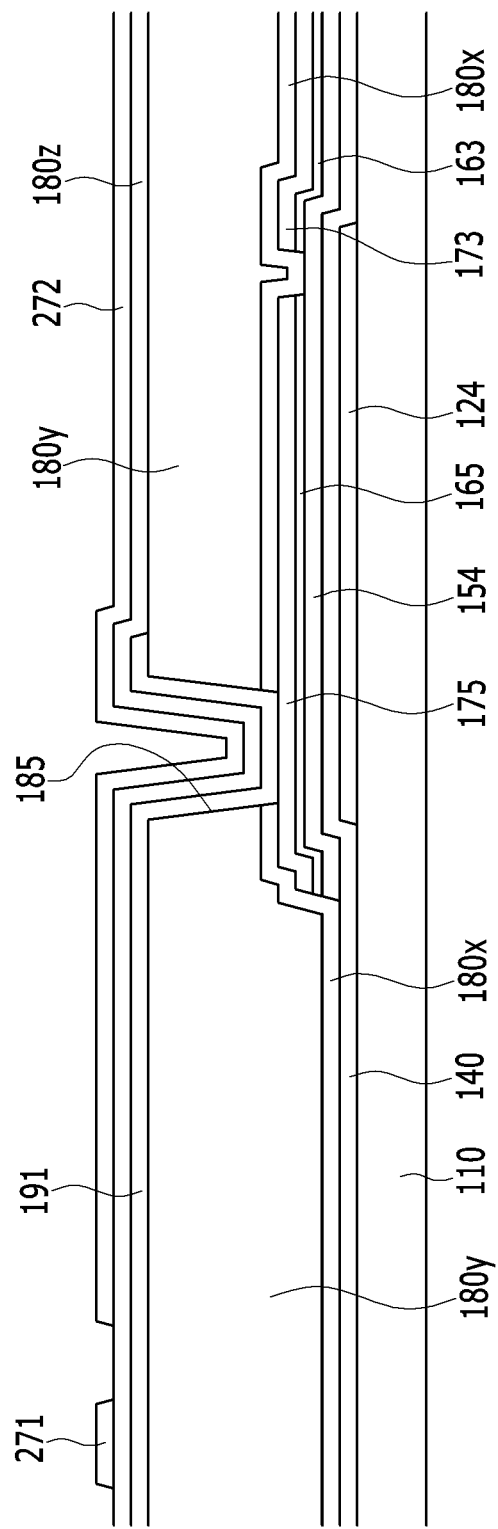
FIG. 3 is a cross-sectional view of the thin film transistor array panel of FIG. 1 taken along line III-III.
Figure 4:
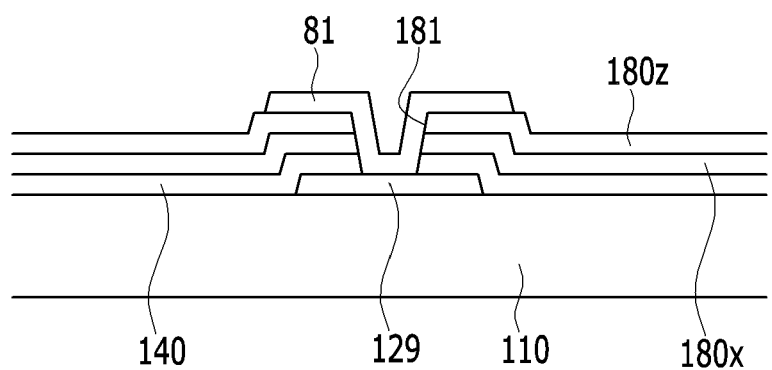
FIG. 4 is a cross-sectional view of the thin film transistor array panel of FIG. 1 taken along line IV-IV.
Figure 5:
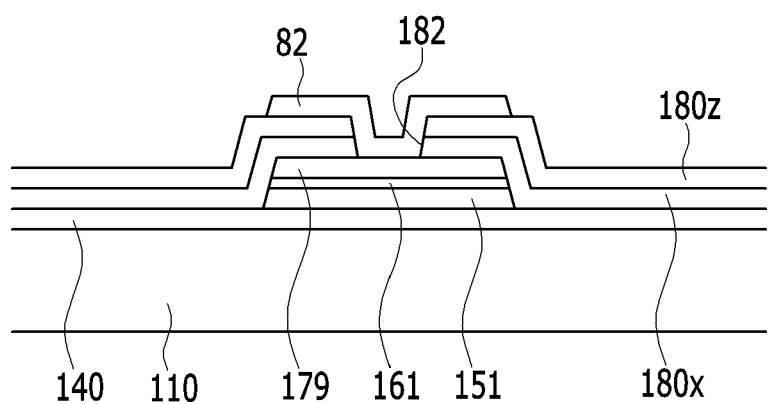
FIG. 5 is a cross-sectional view of the thin film transistor array panel of FIG. 1 taken along line V-V.

First, a thin film transistor array panel according to a first exemplary embodiment will be described with reference to FIG. 1 to FIG. 5. FIG. 1 is a layout view of a thin film transistor array panel according to the first described exemplary embodiment. FIG. 2 is a cross-sectional view taken along line II-II. FIG. 3 is a cross-sectional view taken along line III-III. FIG. 4 is a cross-sectional view taken along line IV-IV. FIG. 5 is a cross-sectional view taken along line V-V.

Referring to FIG. 1 to FIG. 5, a plurality of gate signal conductors that include a plurality of gate lines 121 are formed on a transparent insulation substrate 110

Each of the gate lines 121 includes a plurality of gate electrodes 124 protruding (branching therefrom) downwardly and upwardly relative to the frame of FIG. 1. At the terminal end, a wide gate pad 129 is provided for connecting with another layer and an external driving circuit. The gate line 121 extends through the image displaying area (DA) of the display device, and the gate pad 129 is positioned in a non-displaying peripheral area (PA) near the display area. A gate driving circuit (not illustrated) for generating a gate signal may be mounted on a flexible printed circuit film (not illustrated) attached to the substrate 110 or may be directly mounted on the substrate 110.

When the gate line 121, the gate electrode 124, and the gate pad 129 are collectively referred to herein as the gate signal conductor, such a gate signal conductor 121/124/129 may be formed of a single conductive layer or as multilayered set having two or more conductive layers.

A gate insulating layer 140 that is made of a silicon nitride (SiNx), a silicon oxide (SiOx), or so on (SiOxNy) is formed on the gate conductor 121/124/129.

A plurality of semiconductive islands 151 preferably made of hydrogenated amorphous silicon (simply referred to as a-Si) or crystallized silicon are formed on the gate insulating layer 140. The plurality of semiconductive islands 151 include a respective plurality of protrusions 154 extending therefrom toward the gate electrodes 124.

A plurality of ohmic contacts 161, 163, and 165 are formed on the semiconductive islands 151 and 154.

The ohmic contacts 163 and 165 of the ohmic contacts 161, 163, and 165 are disposed in a pair on the protrusions 154 of the semiconductive islands 151.

The semiconductive islands 151 and 154 may be formed of semiconductive oxides, and in this case, the ohmic contacts 161, 163, and 165 may be omitted.

A data signal conductor including a plurality of data lines 171 and a plurality of drain electrodes 175 is formed on the ohmic contacts 161, 163, and 165.

The data lines 171 transfer data signals and mainly extend in a longitudinal direction to cross with the orthogonally extending gate lines 121. Each of the data lines 171 includes a plurality of source electrodes 173 extending toward the gate electrodes 124 and a data pad part 179 having a wide area for connection with another layer or an external driving circuit. The data line 171 is positioned in the display area and the data pad 179 is positioned in the peripheral area near the display area. A data driving circuit (not shown) generating a data signal may be mounted on a flexible printed circuit film (not shown) attached to the substrate 110 or directly mounted on the substrate 110.

Each data line 171 includes periodically bent portions (e.g., V-shaped portions) where the respective arms of the bend each forms an oblique angle with respect to the extending direction of a gate line 121. The oblique angel between the data line 171 and the extending direction of the gate line 121 may be 45 degrees or more. However, in the case of a liquid crystal display according to another exemplary embodiment of the present disclosure of invention, the data lines 171 may each extend as a straight line.

The source electrode 173 is formed by extending a portion of the data line 171, and the drain electrode 175 includes a portion facing the source electrode 173 with respect to the gate electrode 124. The drain electrode 175 may have a quadrangle shape having the same width as the source electrode 173, and the width of the drain electrode 175 and the source electrode 173 may be the same.

A gate electrode 124, a source electrode 173, and a drain electrode 175 form a thin film transistor Q along with the protrusion 154 of the semiconductive island stripe 151, and the channel of the thin film transistor is formed on the protrusion 154 of the semiconductive island stripe 151 between the source electrode 173 and the drain electrode 175.

A first passivation layer 180x is formed on the data line 171 and the drain electrode 175. The first passivation layer 180x may be formed of an inorganic insulating material such as a silicon nitride (SiNx) or a silicon oxide (SiOx).

An organic layer 180y is positioned on the first passivation layer 180x. The organic layer 180y includes an organic material, and the surface of the organic layer 180y may be substantially flat (planarized). The organic layer 180y is removed in the peripheral area in which the gate pad 129 and data pad 179 are disposed. However, in a case of a thin film transistor array panel according to another exemplary embodiment, the organic layer 180y may extend to also be positioned in the peripheral area corresponding to the gate pad 129 and the data pad 179, and compared with the portion of the organic layer 180y positioned in the display area, the thickness of the organic layer portion 180y positioned on the peripheral area may be thinner.

Although not shown, in the case of the thin film transistor array panel according to yet another exemplary embodiment, the organic layer 180y may include a pigment and may function as a color filter, and in this case, a pigment containment (capping) layer disposed on the organic layer 180y may be further included. For example, the thin film transistor array panel according to another exemplary embodiment may further include a capping layer disposed on the color filter to prevent pigment of the color filter from flowing into a liquid crystal layer, and the capping layer may be formed of an insulating material such as a nitride silicon (SiNx).

A plurality of first field generating electrodes 191 (pixel electrodes) are formed on the organic layer 180y. The first field generating electrodes 191 may be made of a transparent conductive material such as ITO or IZO. In the present exemplary embodiment, the first field generating electrode 191 has a non-perforated plate shape and is positioned within a pixel area enclosed by the gate line 121 and the data line 171. (As seen in FIG. 2, it is the common electrode 271 that is shaped to have field generating stripes. However, this configuration is non-limiting and the pixel electrode may be perforated so as to also have field generating stripes.)

Although it is indicated above that the drawings may include exaggerations of scale, in the case of FIGS. 1-5, the relative dimensions of the features shown are to be understood as being substantially close to scale in particular when showing the drain contact hole 185 as being disposed near one end of an elongated drain electrode 175 and the channel region of the corresponding transistor Q being disposed near or just beyond the opposed other end of the elongated drain electrode 175.

More specifically, the first passivation layer 180x of the display area has a first contact hole 185 (drain contact hole) extending therethrough to expose a corresponding end portion of the drain electrode 175. The first contact hole 185 is aligned in the first passivation layer 180x and the organic layer 180y. The first contact hole 185 is positioned within the region where the one end of the drain electrode 175 is positioned and where a Z-shaped boundary portion of the pixel electrode 191 passes by (see FIG. 1) such that connection with an edge portion of the pixel electrode 191 can be made and the aperture ratio of the thin film transistor array panel is not significantly decreased by instead connecting to the pixel electrode 191 deeper within the interior area of the pixel electrode 191.

In other words, an edge portion of the first field generating electrode 191 is physically and electrically connected to the drain electrode 175 through the first contact hole 185.

A second passivation layer 180z is formed on the first field generating electrode 191 and the organic layer 180y.

The illustrated embodiment has a gate-on-bottom configuration wherein the gate electrode 124 is below the semiconductive island stripe 151 and the drain electrode 175 is above the semiconductive island stripe 151 such that connection to the drain electrode 175 does not entail forming a contact hole through the gate insulating layer 140. Yet more specifically, after the drain contact hole 185 is formed, the material of the first field generating electrode 191 is deposited so as to be positioned within the first contact hole 185 and thereafter it is covered by the second passivation layer 180z. That is, the first contact hole 185 is formed so as to only penetrate through the first passivation layer 180x, but is not formed to penetrate through the gate insulating layer 140 or through the second passivation layer 180z and thus hole-widening due to etching through a insulating layer does not occur more than once (for etching only through the first passivation layer 180x). It is to be noted that the layer 180y through which the drain contact hole 185 also penetrates is an organic insulating layer which is generally less difficult to etch through than are insulating layers (like 180x and 140) and for which excessive hole-widening can often be avoided by use of photoresist resputtering. Therefore, although the organic layer 180y is relatively thick (much thicker than the first passivation layer 180x), etching through that thicker organic layer 180y does not necessarily contribute much to the undesired hole-widening phenomenon and thus the aperture ratio of the pixel units is better preserved.

The second field generating electrode 270 is formed on the second passivation layer 180z of the display area. Also, a first connecting member (contact assistant) 81 and a second contact assistant 82 are formed on the second passivation layer 180z in the peripheral area. The second field generating electrode 270 is patterned to include a plurality of branch electrodes 271 substantially parallel to each other and separated from each other and a plurality of inter-branch connections 272 as seen in FIG. 1. Each branch electrode 271 of the second field generating electrode 270 may be bent according to the data line 171. However, in the thin film transistor array panel according to another exemplary embodiment where the data lines 171 are straight, the branch electrodes 271 of the second electric field generating electrode 270 may be outstretched as straight lines also.

The second field generating electrodes 270 positioned in the adjacent pixel areas are connected to each other through a plurality of inter-pixel connections 272 thereby receiving a voltage of the same magnitude (e.g., Vcom).

Additionally, for the insulating layers, namely, the gate insulating layer 140, the first passivation layer 180x, and the second passivation layer 180z as positioned in the peripheral area (see FIG. 4), these have a second contact hole 181 formed therethrough for exposing the gate pad 129. Moreover, for the insulating layers, namely, the first passivation layer 180x and the second passivation layer 180z as positioned in another part of the peripheral area, these have a third contact hole 182 (see FIG. 5) formed therethrough for exposing the data pad 179. Thus the wider contact holes that penetrate through more insulating layers do not have to be formed in the display area (DA) and instead may be formed only in the peripheral area (PA).

The first contact assistant conductor 81 (see FIG. 4) and the second contact assistant conductor 82 (see FIG. 5) are respectively connected to the contact hole exposed gate pad 129 and the contact hole exposed data pad 179 respectively through the second contact hole 181 and the third contact hole 182. The contact assistants 81 and 82 provide good conductive adhesion with and contact with the data pad 179 and the gate pad 129 respectively for connecting these to an external apparatus, and for protecting these from corrosive chemicals.

As described above, the first field generating electrode 191 positioned within the first contact hole 185 positioned in the display area is covered by the second passivation layer 180z. That is, the first contact hole 185 positioned in the display area is only formed in the first passivation layer 180x, but is not formed in a manner that calls for etching through other insulating layers, namely, the gate insulating layer 140 and the second passivation layer 180z.

On the other hand, the second contact hole 181 which is positioned in the peripheral area (where there is more room for wider contact holes) is formed through the gate insulating layer 140, the first passivation layer 180x, and the second passivation layer 180z. Similarly, the third contact hole 182 is formed through the first passivation layer 180x and the second passivation layer 180z.

Like this, the first contact hole 185 positioned in the display area (DA) is narrower because it is only formed through the first passivation layer 180x. In other words, the width of the first contact hole 185 may be reduced as compared with a case of successively etching also through the first passivation layer 180x, the second passivation layer 180z, and the gate insulating layer 140 so as to form the second contact hole 181, or etching successively through the first passivation layer 180x and the second passivation layer 180z to form the third contact hole 182.

The first field generating electrode 191 is connected to the drain electrode 175 through the first contact hole 185 thereby receiving a data voltage. The second field generating electrode 270 receives a reference voltage (Vcom) input from the outside.

The first field generating electrode 191 and the second field generating electrode 270 are applied with the data voltage and the reference voltage so as to generate an electric field extending into the liquid crystal layer (not shown).

In the case of the thin film transistor array panel according to the present exemplary embodiment, the first field generating electrode 191 of the plate type is disposed under the second passivation layer 180z and the second field generating electrode 270 having a plurality of branch electrodes 271 is disposed on the second passivation layer 180z, however in a case of a thin film transistor array panel according to another exemplary embodiment, the second field generating electrode 270 having a plurality of branch electrodes 271 may be disposed under the second passivation layer 180 while the first field generating electrode 191 of the plate type may be disposed on the second passivation layer 180z. Also, one of the first field generating electrode 191 and the second field generating electrode 270 may include a branch electrode, and the other may be the plate type. Further, one of the first field generating electrode 191 and the second field generating electrode 270 may receive the reference voltage, and the other may be applied with the data voltage.

That is, all characteristics of the thin film transistor array panel according to an exemplary embodiment may be applied to a case that two field generating electrodes are disposed on the thin film transistor array panel.

As described above, in the thin film transistor array panel according to an exemplary embodiment of the present disclosure of invention, when forming the first contact hole 185, only the first passivation layer 180x is etched through and the gate insulating layer 140 is not etched through such that a short circuit is possible between the gate conductor and the drain electrode, for example due to the first field generating electrode 191 extending between the two when the first contact hole 185 overlaps and exposes a portion of the gate conductor.

Figure 6:
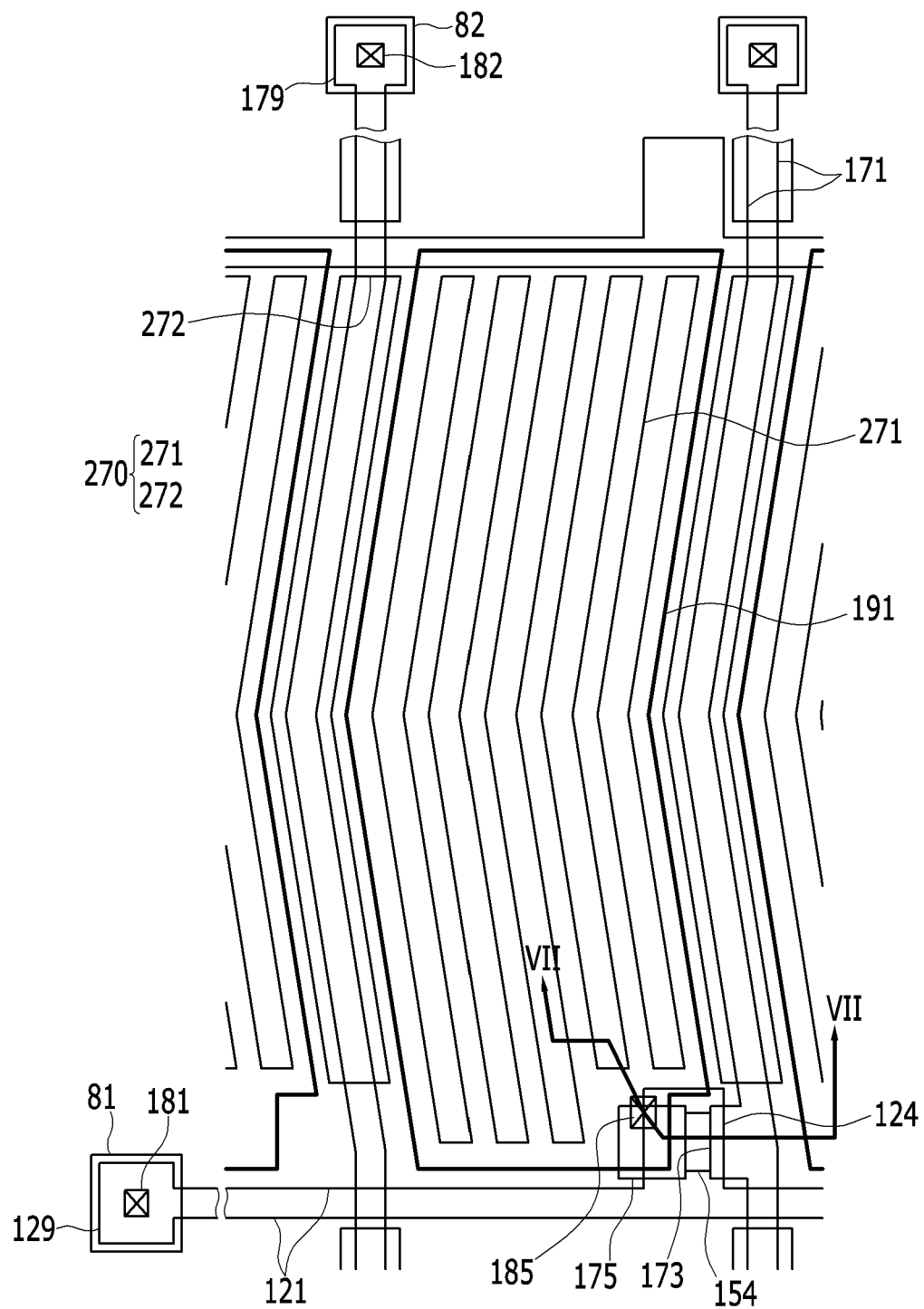
FIG. 6 is a layout view of a thin film transistor array panel according to another exemplary embodiment.

This aspect will be described in greater detail with reference to another embodiment shown in FIG. 6 and FIG. 7. FIG. 6 is a layout top plan view of a thin film transistor array panel according to another exemplary embodiment of the present disclosure of invention, and FIG. 7 is a cross-sectional view of the thin film transistor array panel of FIG. 6 taken along line VII-VII.

Figure 7:
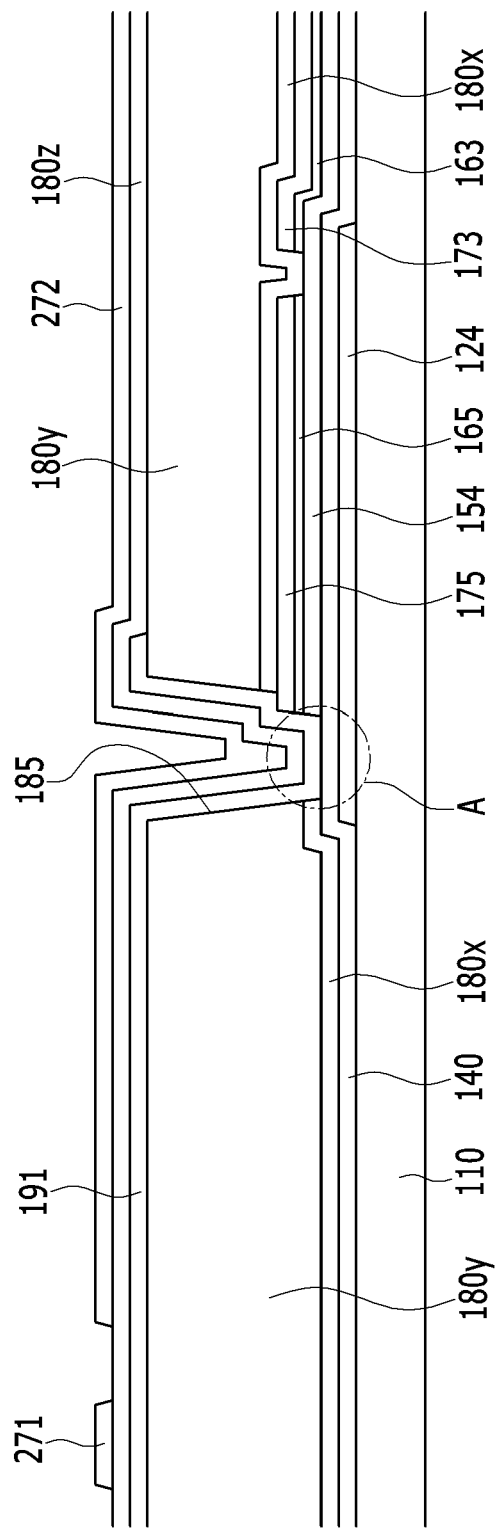
FIG. 7 is a cross-sectional view of the thin film transistor array panel of FIG. 6 taken along line VII-VII.
Figure 8:
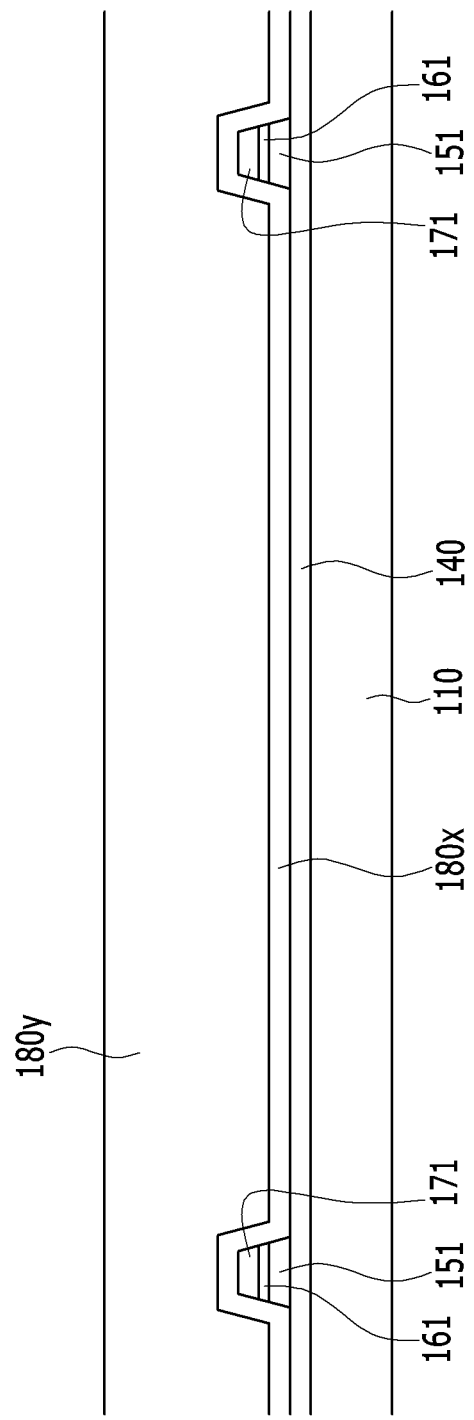
FIGS. 8, 9, 10, and 11 are cross-sectional views sequentially showing a part of a manufacturing method of a thin film transistor array panel according to an exemplary embodiment, taken along the lines II-II, III-III, IV-IV, and V-V of FIG. 1.

Referring to FIG. 6 and FIG. 7, the thin film transistor array panel according to the present exemplary embodiment is substantially similar to the thin film transistor array panel according to the exemplary embodiment shown in FIG. 1 to FIG. 5 except that the drain contact hole 185 has been moved to partially extend beyond the edge of the drain electrode 175 and thereby expose sidewall surfaces of the drain electrode 175 and of the protrusion 154 of the semiconductive island stripe 151. A description of the same constituent elements is omitted.

More specifically, in the thin film transistor array panel according to the present exemplary embodiment, the first contact hole 185 is disposed over the end of the drain electrode 175 and is simultaneously positioned above a portion of the gate electrode 124 in region "A". That is, the first contact hole 185 overlaps the gate conductor where the latter is not overlapped by the data conductor.

Referring to FIG. 7, the first contact hole 185 exposes a portion of the upper surface of the drain electrode 175 and the sidewall surface of the drain electrode 175 and is formed at the position overlapping the gate electrode 124 in the portion denoted as "A". The gate insulating layer 140 prevents the pixel electrode 191 from contacting the gate electrode 124.

If, during the formation of the first contact hole 185, the etchings were carried out in the same way as permitted in the peripheral area (PA) for forming the second contact hole 181 and the third contact hole 182 by etching through the gate insulating layer 140 after etching through the first passivation layer 180x (and through the second passivation layer 180z), the gate insulating layer 140 positioned in the portion A of FIG. 7 would similarly (hypothetically speaking) be etched through such that the gate electrode 124 is exposed in region "A". Accordingly, a short circuit would develop by way of the first field generating electrode 191 extending inside the first contact hole 185 and shorting together the gate electrode 124 and the drain electrode 175 (undesirably).

However, for the case of the thin film transistor array panel according to the exemplary embodiment of FIG. 7, the material of the gate insulating layer 140 acts as an etch stop for the selective etch applied to the different material of the first passivation layer 180x. Therefore, when forming the first contact hole 185, only the first passivation layer 180x is selectively etched through and the gate insulating layer 140 is not etched through such that the undesired short circuit between the gate conductor and the drain electrode is prevented even though the first contact hole 185 overlaps a portion of the gate conductor.

Many characteristics of the thin film transistor array panel according to an exemplary embodiment shown in FIG. 1 to FIG. 5 may be applied to the thin film transistor array panel according to the present exemplary embodiment of FIG. 7.

Figure 12A:
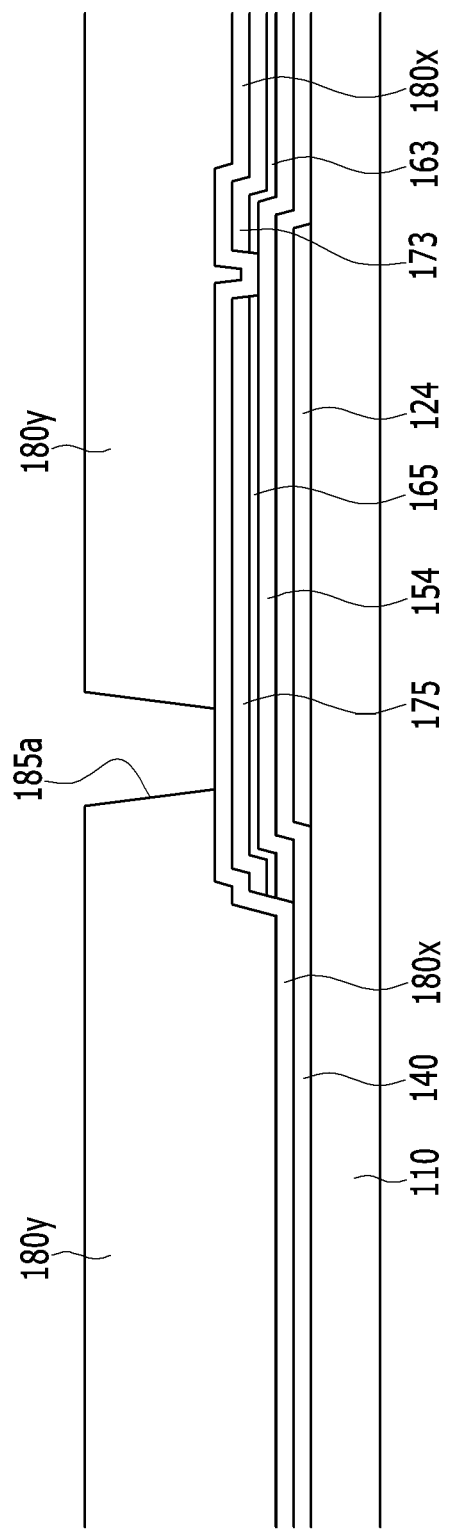
FIG. 12A and FIG. 12B are cross-sectional views sequentially showing a part of a manufacturing method of a thin film transistor array panel according to an exemplary embodiment, taken along the line III-III of FIG. 1.
Figure 12B:
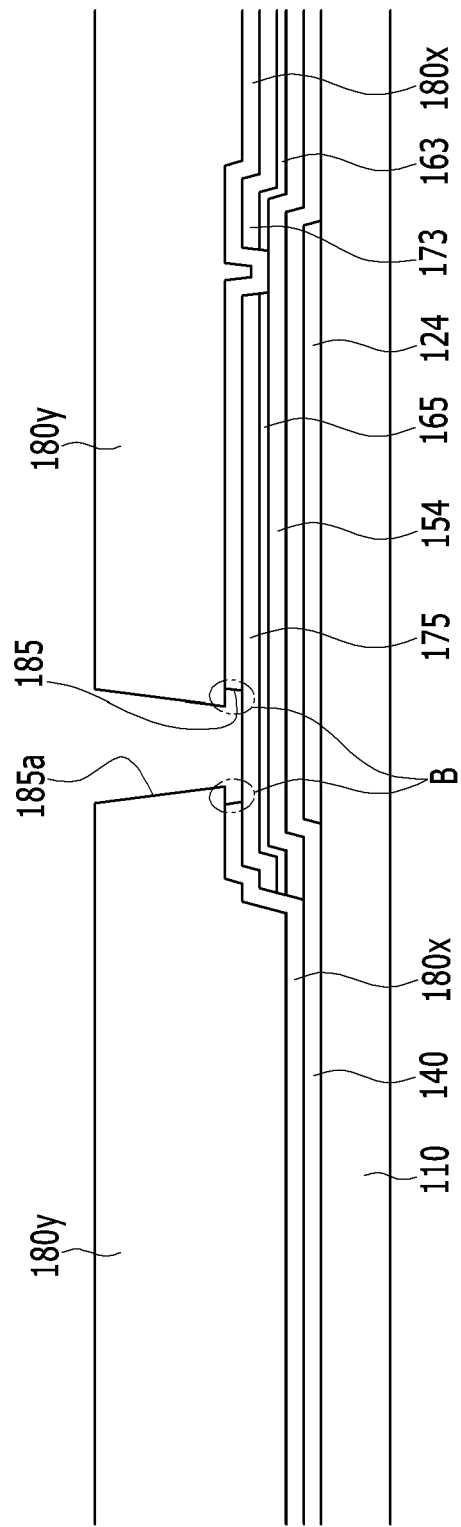
Figure 14:
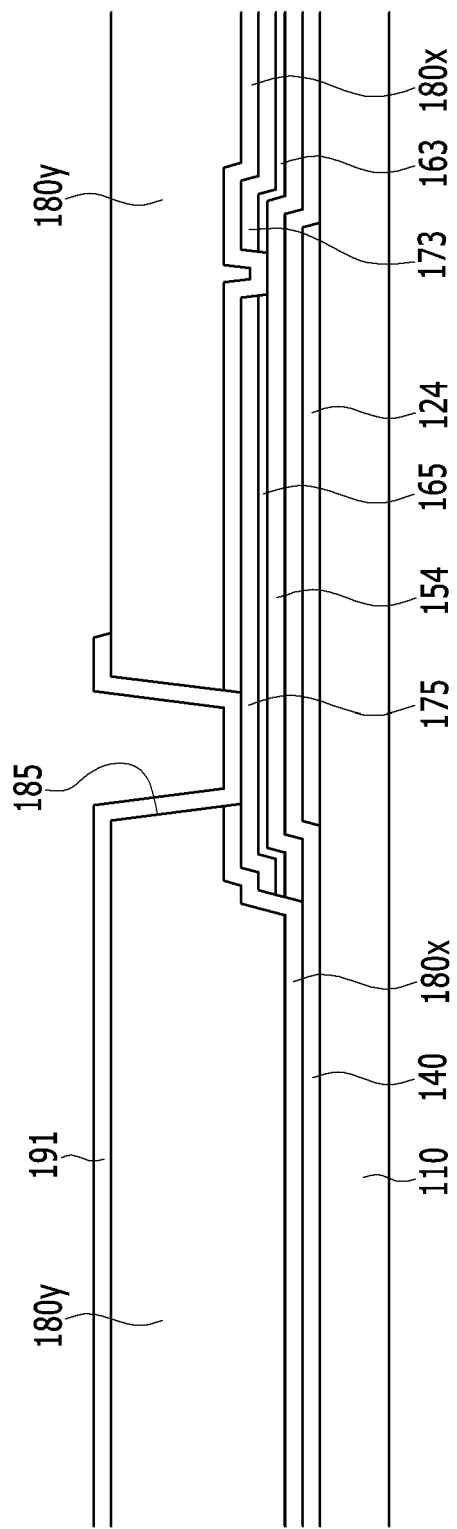
Figure 15:
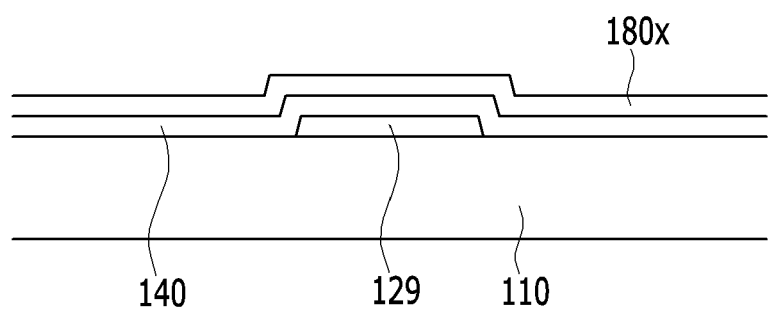
Figure 16:
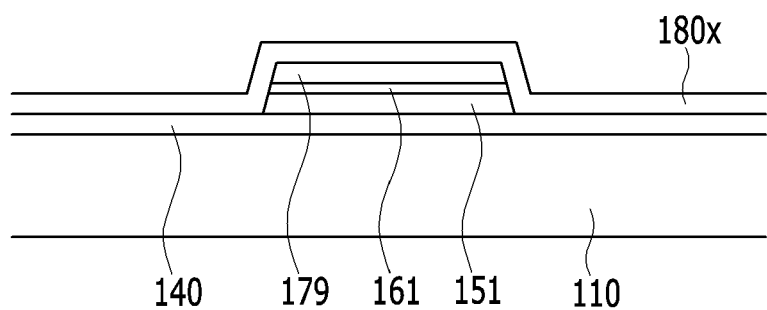
Figure 17:
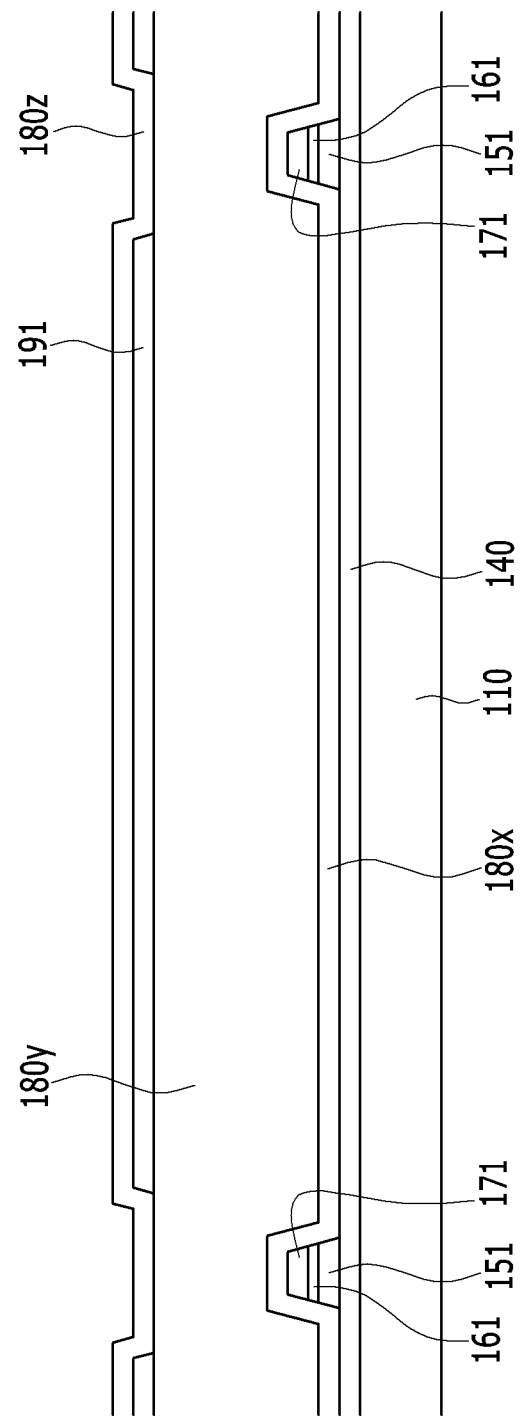
Figure 18:
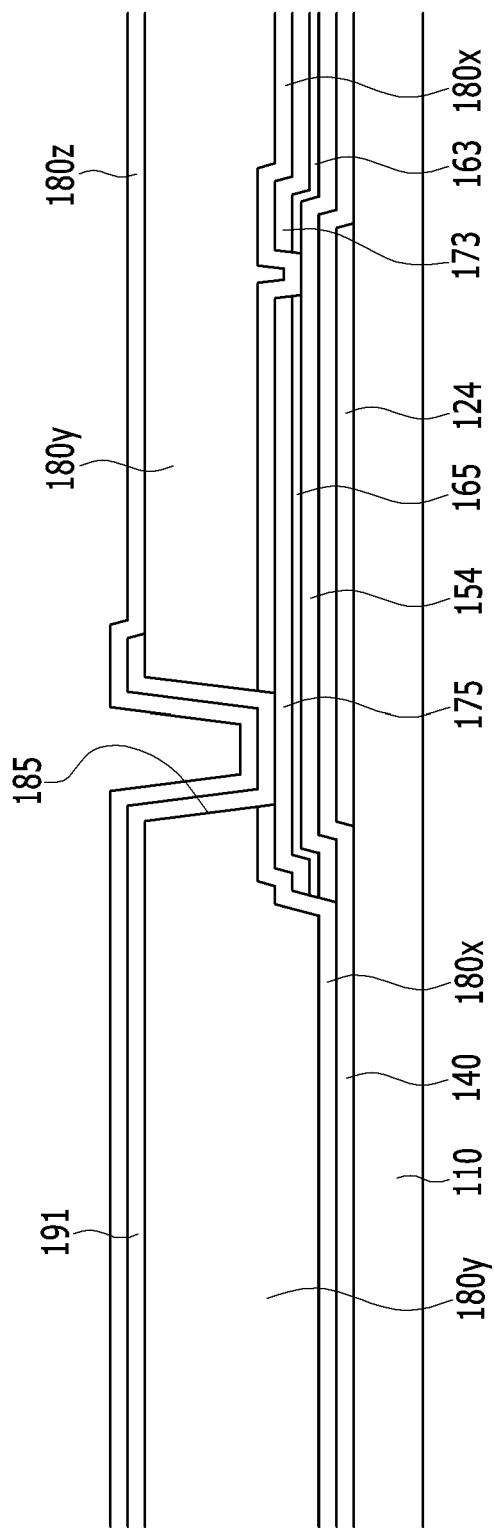
Figure 19:
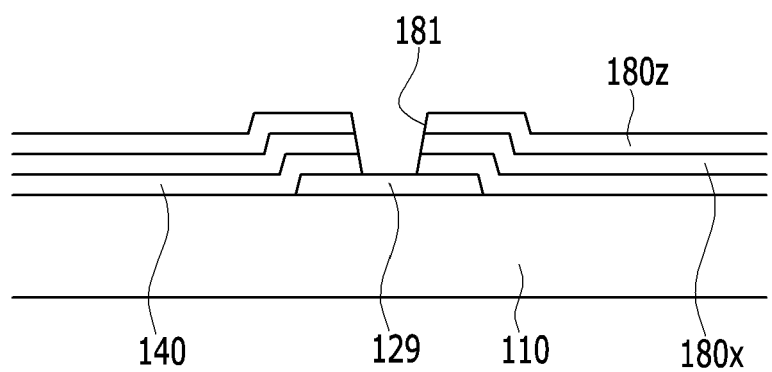
Figure 20:
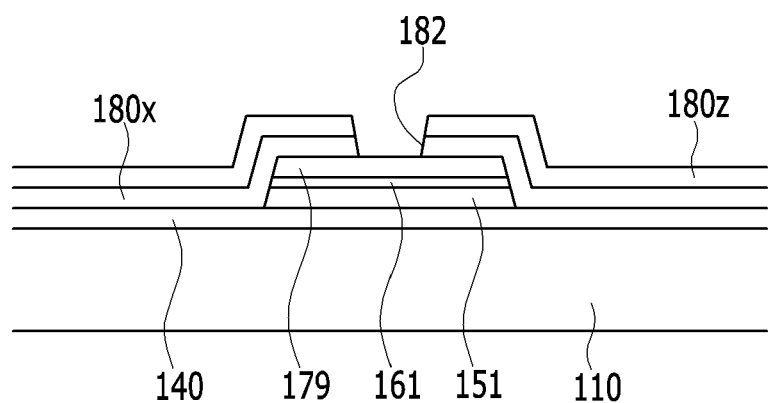
Figure 21:
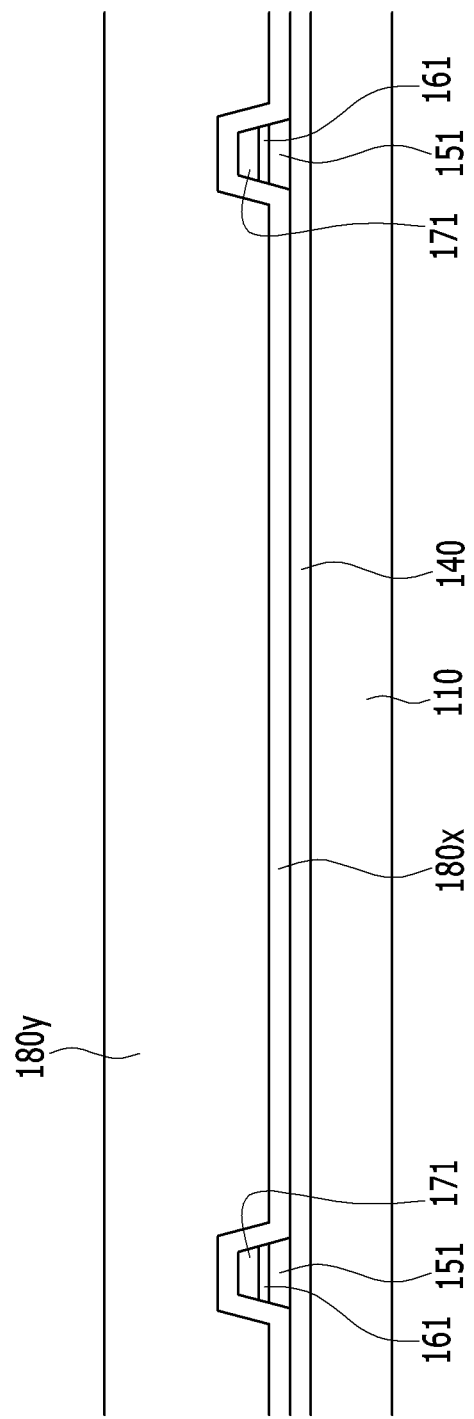
FIGS. 21, 22, 23, and 24 are cross-sectional views sequentially showing a part of a manufacturing method of a thin film transistor array panel according to another exemplary embodiment, taken along the lines II-II, III-III, IV-IV, and V-V of FIG. 1.

Next, a manufacturing method of the thin film transistor array panel according to an exemplary embodiment will be described with reference to FIG. 8 to FIG. 20 as well as FIG. 1 to FIG. 5. FIG. 8 to FIG. 11 are cross-sectional views sequentially showing a part of a manufacturing method of a thin film transistor array panel according to an exemplary embodiment, taken along the lines II-II, III-III, IV-IV, and V-V of FIG. 1. FIG. 12A and FIG. 12B are cross-sectional views sequentially showing a part of a manufacturing method of a thin film transistor array panel according to an exemplary embodiment, taken along the line III-III of FIG. 1. FIG. 13 to FIG. 16 and FIG. 17 to FIG. 20 are cross-sectional views partially showing a manufacturing method of a thin film transistor array panel according to an exemplary embodiment, taken along the lines II-II, III-III, IV-IV, and V-V of FIG. 1.

Firstly, as shown in FIG. 8 to FIG. 11, a gate conductor 121/124/129 including a gate electrode 124 and a gate pad 129 is formed on a transparent insulation substrate 110, a gate insulating layer 140 is formed on the gate conductor 121/124/129, and semiconductive islands 151 and 154, ohmic contacts 161, 163, and 165, a source electrode 173, and a data conductor 171, 173, 175, and 179 including a data line 171 having a data pad 179 and a drain electrode 175 are formed.

Next, the first passivation layer 180x is formed on the data conductor 171, 173, 175, and 179, an organic layer 180y is formed on the first passivation layer 180x, and the first contact hole 185 is formed in the first passivation layer 180x. At this time, the first contact hole 185 is aligned in the first passivation layer 180x and the organic layer 180y. The organic layer 180y may also be positioned in the peripheral area, and in this case, the thickness of the organic layer 180y positioned in the peripheral area may be thinner than the thickness of the organic layer 180y positioned in the display area.

Figure 9:
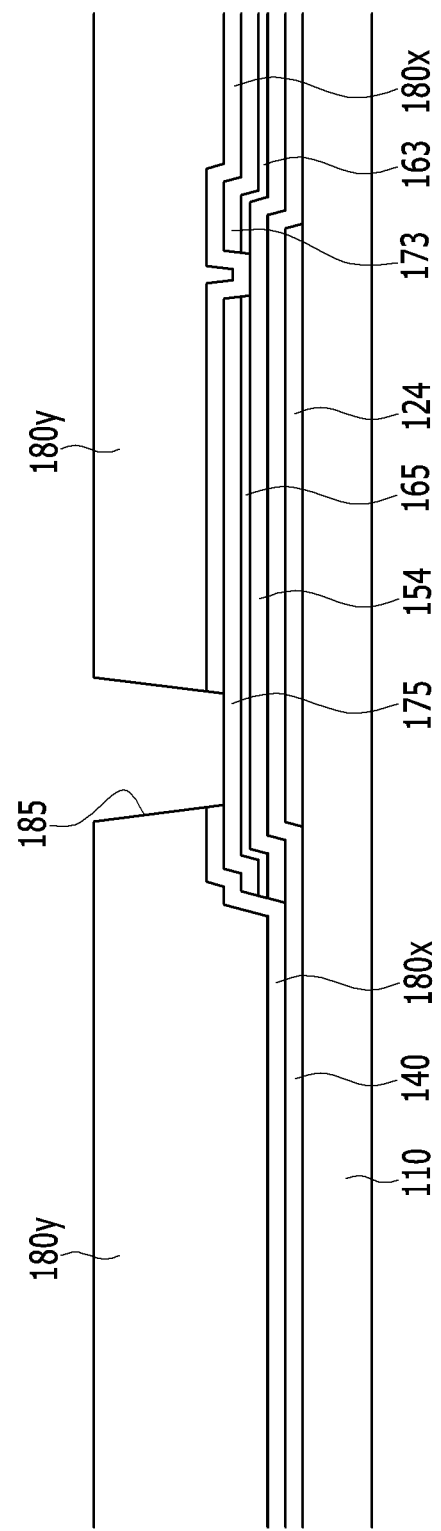
Figure 10:
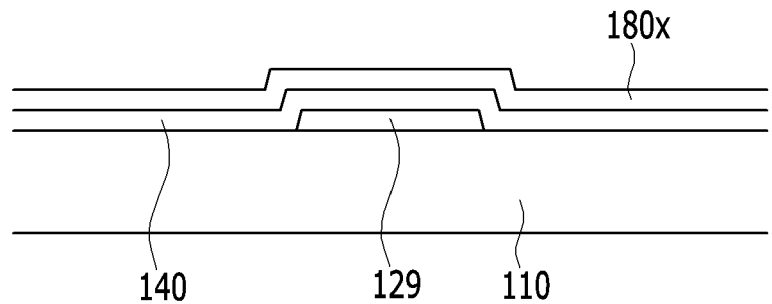
Figure 11:
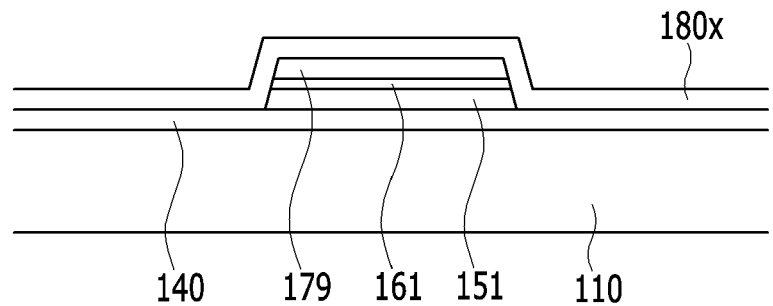

Next, a method of forming the first contact hole will be described with reference to FIG. 12A and FIG. 12B as well as FIG. 9.

Firstly, as may be surmised from FIG. 12A, the first passivation layer 180x is deposited on the data conductor 171, 173, 175, and 179, and then the organic layer 180y is formed on the first passivation layer 180x. At this time, the organic layer 180y is patterned to have a first opening 185a where shown. The width of the bottom of the first opening 185a may be narrower than the bottom width of the ultimately formed first contact hole 185.

Next, as shown in FIG. 12B, by using the patterned organic layer 180y as an etching mask, the first passivation layer 180x is etched (e.g., isotropically etched) to form the illustrated first contact hole 185 in and through the first passivation layer 180x. At this time, as shown in the portion B, the first contact hole 185 formed in the first passivation layer 180x is wider than (undercuts) the bottom sidewalls of the first opening 185a of the organic layer 180y due to side etching. Next, the organic layer 180y is partially removed by a chemical mechanical polishing method (CMP) such that the width of the first opening 185a becomes equal to or wider than the first contact hole 185 while decreasing the height of the organic layer 180y, and forming the first contact hole 185 aligned in the first passivation layer 180x and the organic layer 180y.

Like this, by forming the first contact hole 185 by using the organic layer 180y as the etching mask prior to planarization thereof, one exposure process is required such that a manufacturing cost may be reduced.

Next, as shown in FIG. 13 to FIG. 16, the first field generating electrode 191 is formed, patterned and connected to the drain electrode 175 through the first contact hole 185.

Referring to FIG. 17 to FIG. 20, next (after planarization of 180y and formation of 191), the second passivation layer 180z is deposited on the first field generating electrode 191 in the display area (DA) and the second passivation layer 180z is also deposited in the peripheral area (PA), and then in the peripheral area (PA), the gate insulating layer 140, the first passivation layer 180x, and the second passivation layer 180z are etched through to thereby form in the PA, the second contact hole 181 exposing the gate pad 129, and the first passivation layer 180x and the second passivation layer 180z are etched together to form the third contact hole 182 exposing the data pad 179.

Next, as shown in FIG. 2 to FIG. 5, the second field generating electrode 270 is formed on the second passivation layer 180z of the display area, and the first contact assistants 81 and the second contact assistants 82 are formed on the second contact hole 181 and the third contact hole 182 in the peripheral area (PA).

That is, inside the display area (DA) the corresponding first contact holes 185 (drain contact holes) are formed by only etching through the first passivation layer 180x (as among the insulating layers) while not etching through the gate insulating layer 140 and the second passivation layer 180z.

By contrast, in the peripheral area (PA), the second contact hole 181 is formed by etching through plural ones of the insulating layers, namely, through the gate insulating layer 140, through the first passivation layer 180x, and through the second passivation layer 180z. Similarly, the third contact hole 182 is formed by etching through the first passivation layer 180x and the second passivation layer 180z.

Like this, according to the manufacturing method of the thin film transistor array panel according to an exemplary embodiment, the first contact holes 185 (e.g., drain contact holes) positioned inside the display area are formed as smaller holes by only etching through the first passivation layer 180x (as among the insulating layers) such that the width of the first contact hole 185 may be reduced compared with a case of etching through plural ones of the insulating layers, namely, through the first passivation layer 180x, the second passivation layer 180z, and the gate insulating layer 140 together to form the second contact hole 181, or etching through the first passivation layer 180x and the second passivation layer 180z together to form the third contact hole 182. Also, according to the manufacturing method of the thin film transistor array panel according to an exemplary embodiment, when forming the first contact holes 185, only the first passivation layer 180x is etched and the gate insulating layer 140 is not etched such that a short circuit of the gate conductor and the drain electrode due to deposition of the material of the first field generating electrode 191 may be prevented when the first contact hole 185 overlaps a portion of the gate conductor.

Figure 25A:
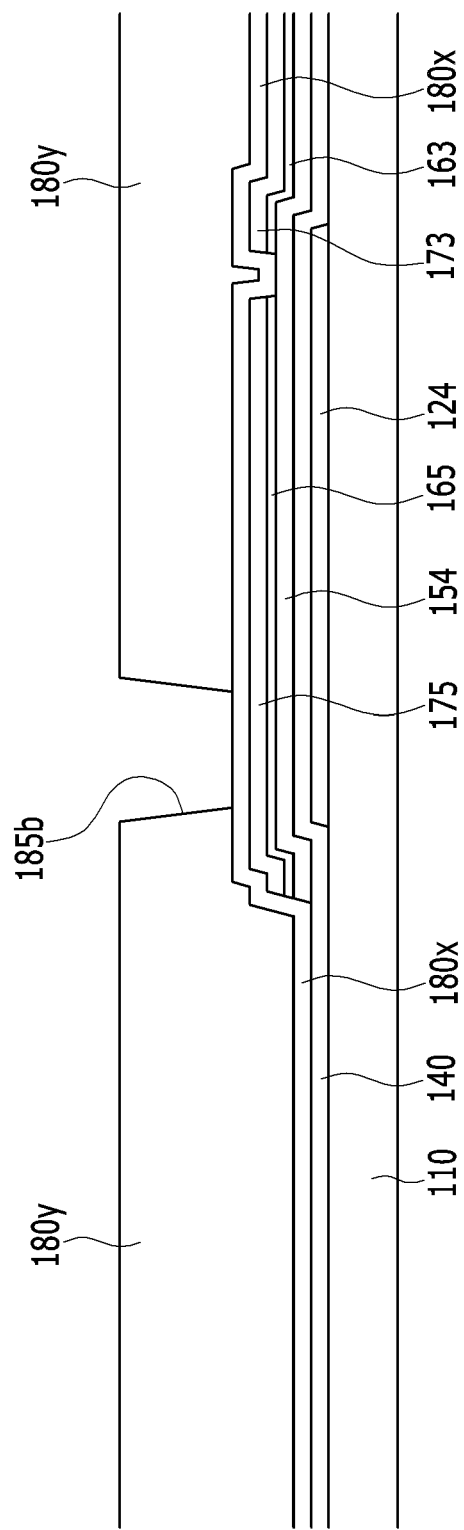
Figure 25C:
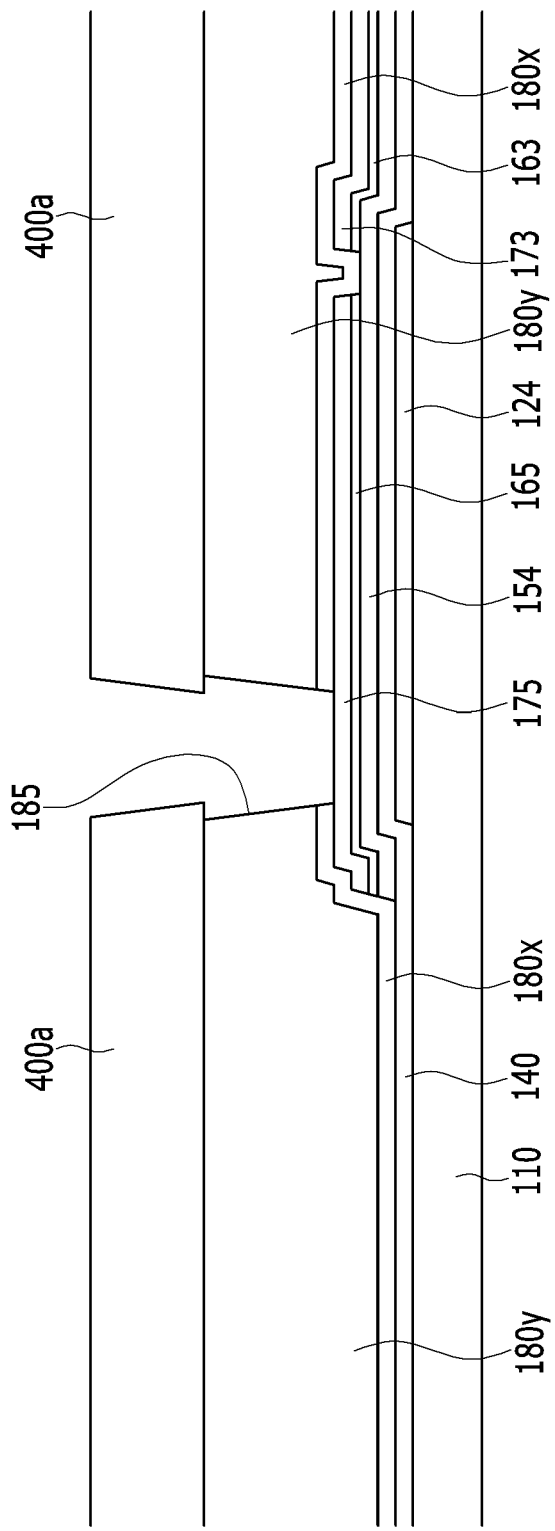
Figure 26:
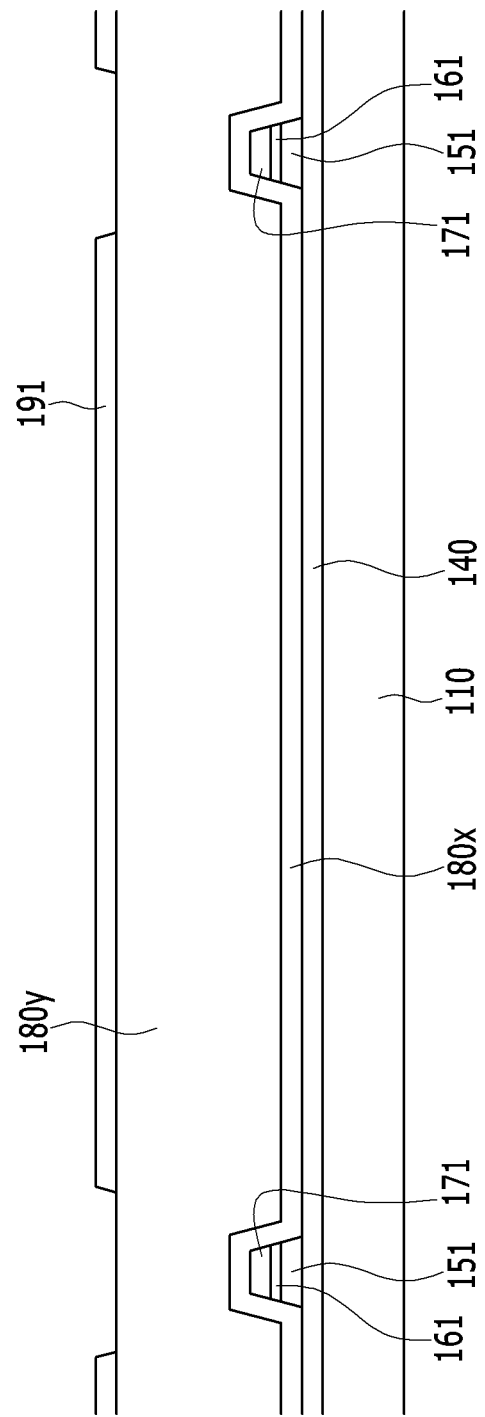
FIGS. 26, 27, 28, 29, 30, 31, 32, and 33 are cross-sectional views sequentially showing a part of a manufacturing method of a thin film transistor array panel according to another exemplary embodiment, taken along the lines II-II, III-III, IV-IV, and V-V of FIG. 1.
Figure 27:
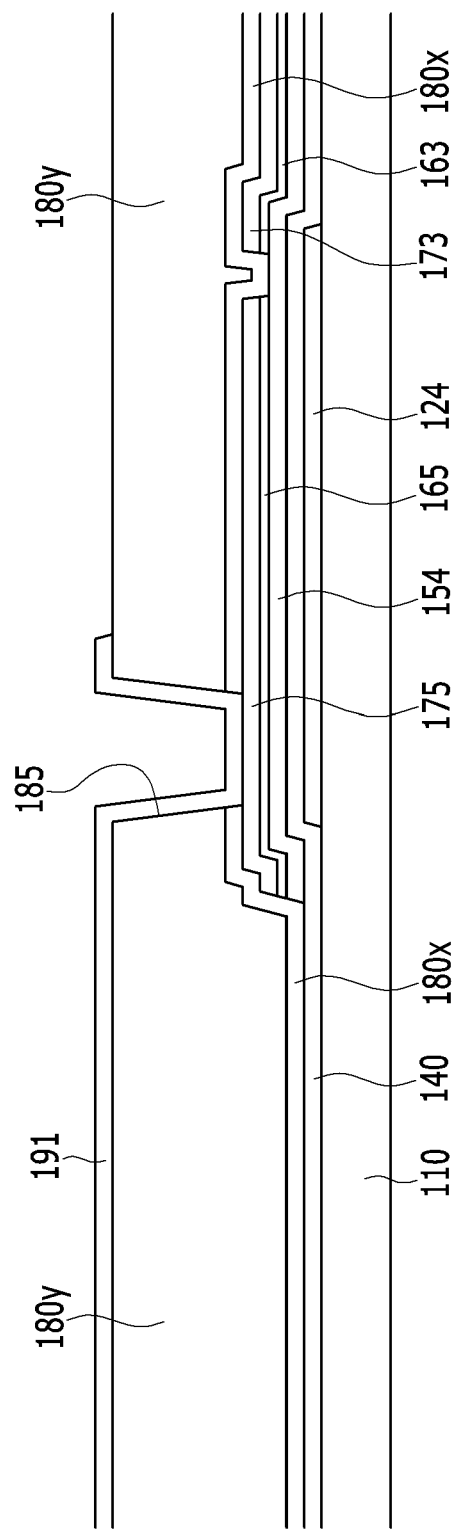
Figure 28:
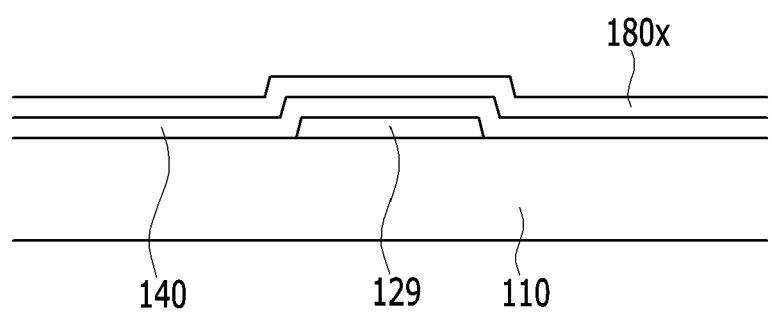
Figure 29:
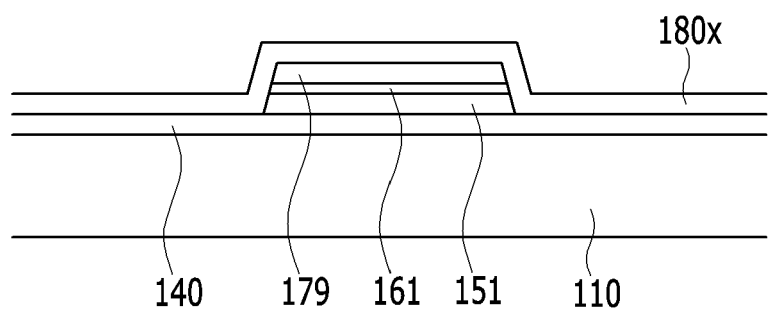
Figure 30:
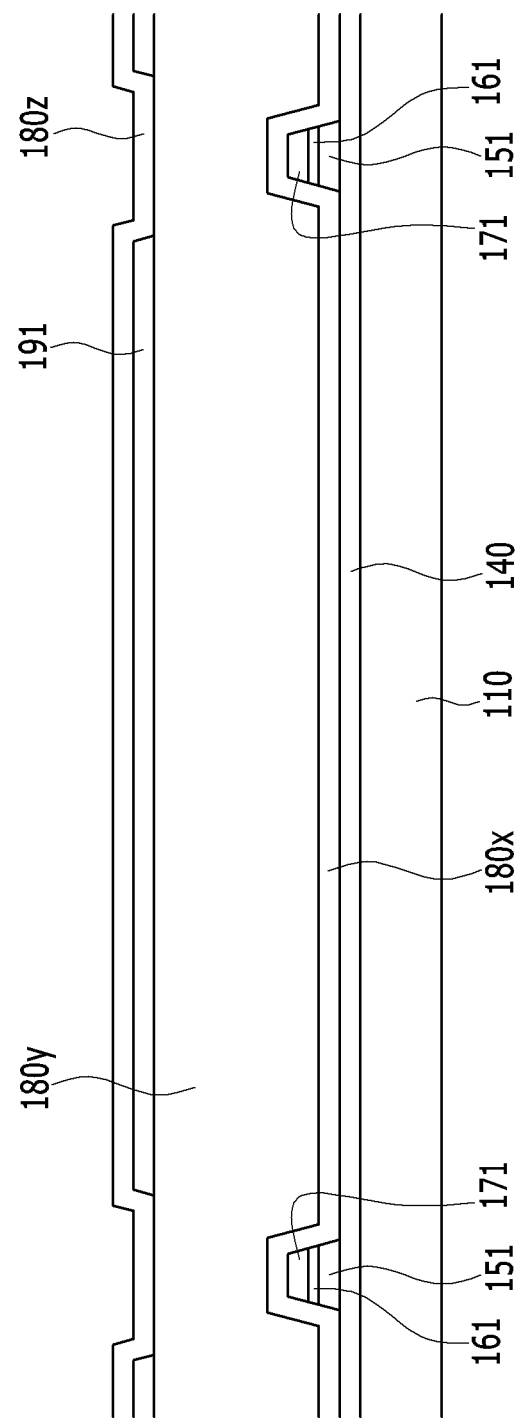
Figure 31:
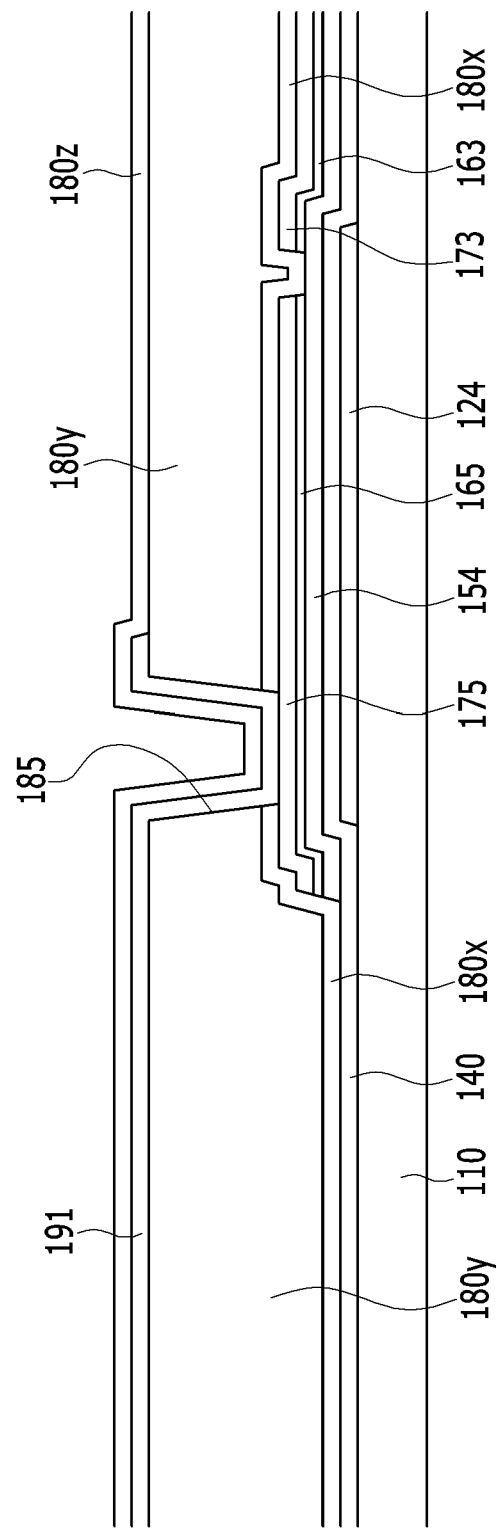
Figure 32:
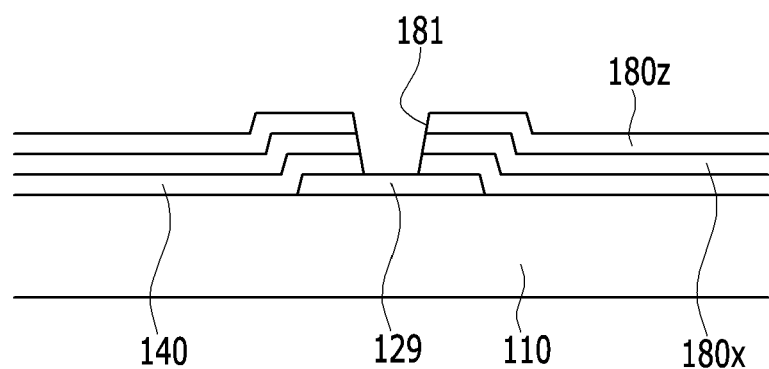
Figure 33:
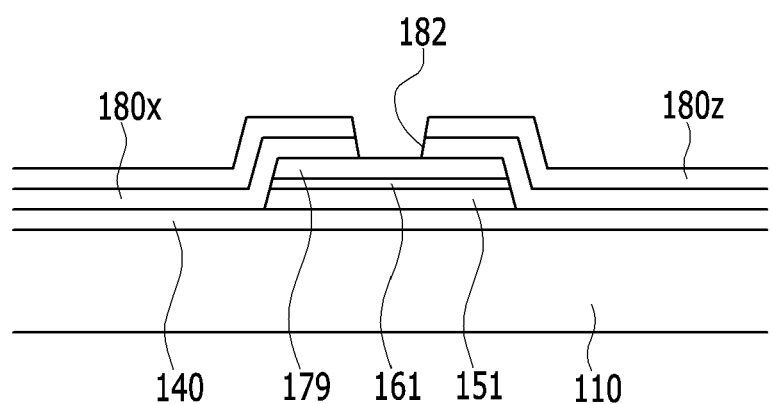

Next, a manufacturing method of the thin film transistor array panel according to another exemplary embodiment will be described with reference to FIG. 21 to FIG. 33 as well as FIG. 1 to FIG. 5. FIG. 21 to FIG. 24 are cross-sectional views sequentially showing a part of a manufacturing method of a thin film transistor array panel according to another exemplary embodiment, taken along the lines II-II, III-III, IV-IV, and V-V of FIG. 1. FIG. 25A to FIG. 25C are cross-sectional views sequentially showing a part of a manufacturing method of a thin film transistor array panel according to another exemplary embodiment, taken along the line III-III of FIG. 1. FIG. 26 to FIG. 29 and FIG. 30 to FIG. 33 are cross-sectional views sequentially showing a part of a manufacturing method of a thin film transistor array panel according to another exemplary embodiment, taken along the lines II-II, III-III, IV-IV, and V-V of FIG. 1.

Firstly, as shown in FIG. 21 to FIG. 24, a gate conductor 121/124/129 including a gate electrode 124 and a gate pad 129 is formed on a transparent insulation substrate 110, a gate insulating layer 140 is formed on the gate conductor 121/124/129, and semiconductive islands 151 and 154, ohmic contacts 161, 163, and 165, a source electrode 173, and a data conductors 171, 173, 175, and 179 including a data line 171 having a data pad 179 and a drain electrode 175 are formed.

Next, the first passivation layer 180x is formed on the data conductors 171, 173, 175, and 179, an organic layer 180y is formed on the first passivation layer 180x, and the first contact hole 185 is formed in and through the first passivation layer 180x. At this time, the first contact hole 185 is aligned in the first passivation layer 180x and the organic layer 180y. At this time, the organic layer 180y may also be positioned in the peripheral area, and in this case, the thickness of the organic layer 180y positioned in the peripheral area (PA) may be thinner than the thickness of the organic layer 180y positioned in the display area (DA).

Figure 22:
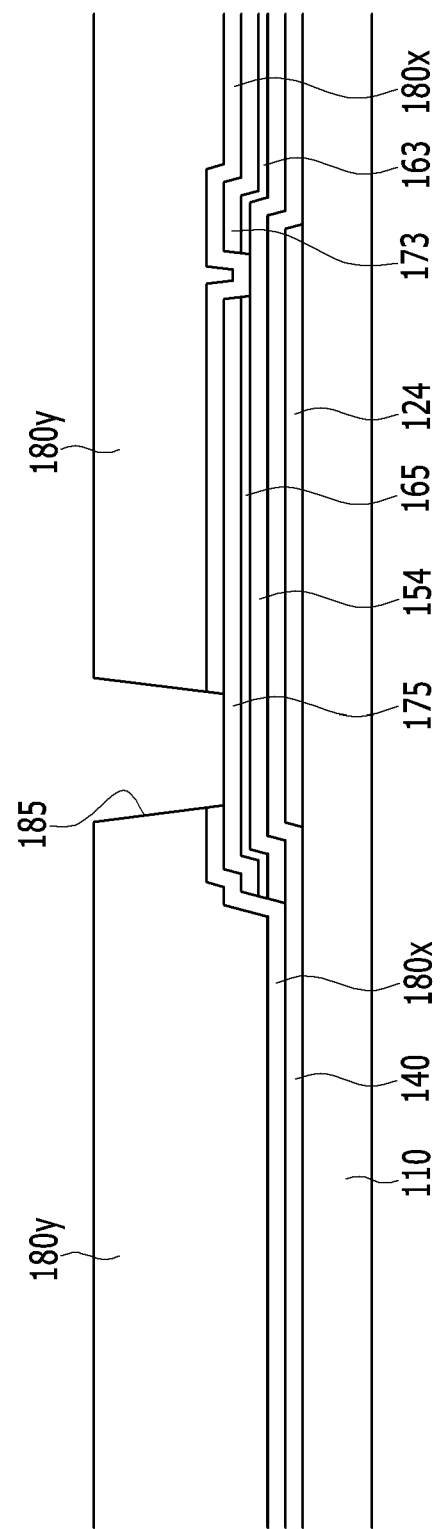
Figure 23:
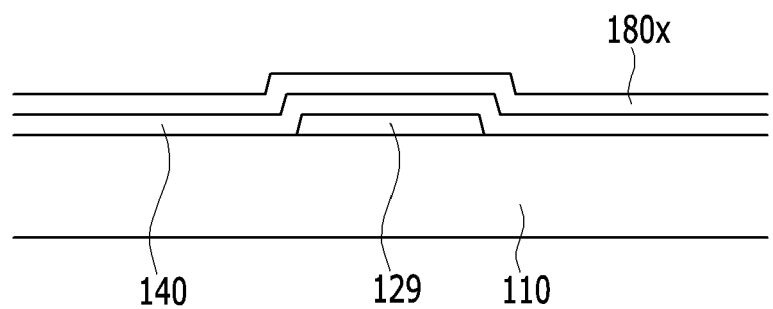
Figure 24:
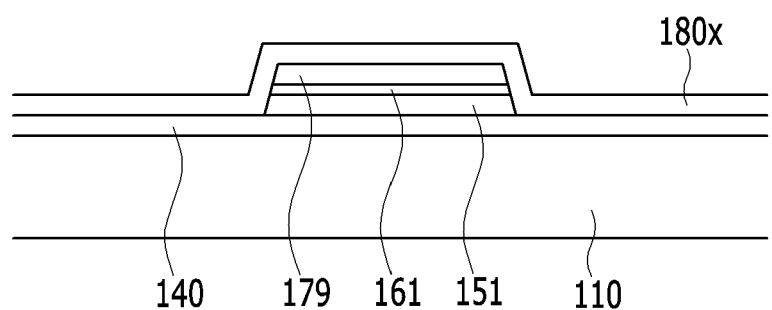

Next, a method of forming the first contact hole will be described with reference to FIG. 25A to 25C as well as FIG. 22.

Firstly, as shown in FIG. 25A, the first passivation layer 180x is formed on the data conductors 171, 173, 175, and 179, and an organic layer 180y is formed on the first passivation layer 180x. At this time, the organic layer 180y has a second opening 185b. The width at the bottom of the second opening 185b may be almost equal to the desired width of the first contact hole 185 through the first passivation layer 180x.

Next, as shown in FIG. 25B, a photosensitive film pattern 400a is formed on the organic layer 180y.

Next, as shown in FIG. 25C, by using the photosensitive film pattern 400a as an etching mask (having an opening size smaller than that of the top of the tapered opening through the organic layer 180y), the first passivation layer 180x is etched to form the first contact hole 185 (having an opening size smaller than that of the top of the tapered opening through the organic layer 180y) in and through the first passivation layer 180x. Here, the first contact hole 185 is aligned in the first passivation layer 180x and the organic layer 180y. Next, the photosensitive film pattern 400a is selectively removed (for example by a planarizing CMP process), as shown in FIG. 22, to complete the first contact hole 185.

Like this, by using the additional photosensitive film pattern 400a as the etching mask to form the first contact hole 185, compared with the previous exemplary embodiment of forming the first contact hole 185 by using the organic layer 180y as the etching mask, the process of forming the photosensitive film pattern 400a is required, however the chemical mechanical polishing (CMP) of the organic layer 180y to prevent the undercut may be omitted in this case.

Next, as shown in FIG. 26 to FIG. 29, the first field generating electrode 191 connected to the drain electrode 175 through the first contact hole 185 is formed in the display area (DA).

Referring to FIG. 30 to FIG. 33, the second passivation layer 180z is deposited on the first field generating electrode 191 of the display area and the second passivation layer 180z is deposited in the peripheral area, and then the gate insulating layer 140, the first passivation layer 180x, and the second passivation layer 180z are etched together in the peripheral area to form the second contact hole 181 exposing the gate pad 129, and the first passivation layer 180x and the second passivation layer 180z are etched together to form the third contact hole 182 exposing the data pad 179.

Next, as shown in FIG. 2 to FIG. 5, the second field generating electrode 270 is formed and patterned on the second passivation layer 180z of the display area, and the first contact assistants 81 and the second contact assistants 82 are formed and patterned in and around the second contact hole 181 and the third contact hole 182 in the peripheral area.

That is, the first contact hole 185 positioned in the display area (DA) is formed by etching through only the first passivation layer 180x (as among the insulating layers present in the display area (DA)), but is not formed by etching through (in the DA) the gate insulating layer 140 and the second passivation layer 180z.

However, for the case of the peripheral area (PA), the second contact hole 181 positioned in the peripheral area is formed by etching through the gate insulating layer 140, the first passivation layer 180x, and the second passivation layer 180z, and the third contact hole 182 is formed by etching through the first passivation layer 180x and the second passivation layer 180z.

Like this, according to the manufacturing method of the thin film transistor array panel according to an exemplary embodiment, the first contact holes 185 (e.g., drain contact holes) which are positioned inside the display area (DA) are formed by etching through only the first passivation layer 180x (as among the insulating layers ultimately present in the display area (DA)) such that the width of the so-formed first contact holes 185 may be reduced compared with a case of etching through plural insulating layers in the peripheral area (PA), more specifically through the first passivation layer 180x, the second passivation layer 180z, and the gate insulating layer 140 together to form the second contact hole 181, or etching through the first passivation layer 180x and the second passivation layer 180z together to form the third contact hole 182 in the peripheral area (PA). Also, according to the manufacturing method of the thin film transistor array panel according to an exemplary embodiment, when forming the first contact holes 185, only the first passivation layer 180x is etched and the gate insulating layer 140 is not etched such that the short of the gate conductor and the drain electrode due to deposition of the material of the first field generating electrode 191 may be prevented when the first contact hole 185 overlaps a portion of the gate conductor.

It is described that in a case of the thin film transistor array panel according to the exemplary embodiment, either one of the two electric field generating electrodes overlapping each other has the plate shape and the other has the branch portion, but the present disclosure of invention is applicable to a thin film transistor array panel having any other shape including two electric field generating electrodes in one display panel.

While this disclosure of invention has been provided in connection with what are presently considered to be practical exemplary embodiments, it is to be understood that the present teachings are not limited to the disclosed embodiments, but, on the contrary, they are intended to cover various modifications and equivalent arrangements included within the spirit and scope of the teachings.

What is claimed is:
1. A thin film transistor array comprising:
a substrate;
a gate line including a gate pad and disposed on the substrate;
a gate insulating layer disposed on the gate line and the gate pad;
a data line including a data pad and disposed on the gate insulating layer;
a first passivation layer disposed on the data line;
a first electrode disposed on the first passivation layer;
a second passivation layer disposed on the first electrode; and
a second electrode disposed on the second passivation layer,
wherein the gate pad is exposed through a first contact hole, and
wherein the gate insulating layer, the first passivation layer, and the second passivation layer include at least a portion of the first contact hole.
2. The thin film transistor array of claim 1, wherein the first contact hole extends through the gate insulating layer, the first passivation layer, and the second passivation layer.

3. The thin film transistor array of claim 1, further comprising:
an organic layer disposed between the first passivation layer and the second passivation layer,
wherein the substrate has a display area displaying images and a peripheral area disposed near the display area, and
wherein the organic layer is disposed in the display area and is not disposed in the peripheral area.

4. The thin film transistor array of claim 3, further comprising:
a drain electrode disposed on the gate insulating layer and connected to one of the first electrode and the second electrode through a second contact hole, and
wherein the organic layer and the first passivation layer include at least a portion of the second contact hole.

5. The thin film transistor array of claim 4, wherein the second contact hole overlaps a portion of the gate line not overlapping the drain electrode, and wherein the portion of the gate line overlapping the second contact hole is covered by the gate insulating layer.

6. The thin film transistor array of claim 3, wherein the first passivation layer and the second passivation layer include at least a portion of a third contact hole exposing the data pad.

7. The thin film transistor array of claim 1, further comprising:
an organic layer disposed between the first passivation layer and the second passivation layer,
wherein the substrate has a display area displaying images and a peripheral area disposed near the display area,
wherein the organic layer is disposed in the display area and the peripheral area, and
wherein the thickness of a portion of the organic layer disposed in the peripheral area is thinner than the thickness of a portion of the organic layer disposed in the display area.

8. The thin film transistor array of claim 7, further comprising:
a drain electrode disposed on the gate insulating layer and connected to one of the first electrode and the second electrode through a second contact hole, and
wherein the organic layer and the first passivation layer include at least a portion of the second contact hole.

9. The thin film transistor array of claim 8, wherein the second contact hole overlaps a portion of the gate line not overlapping the drain electrode, and wherein the portion of the gate line overlapping the second contact hole is covered by the gate insulating layer.

10. The thin film transistor array of claim 7, wherein the first passivation layer and the second passivation layer include at least a portion of a third contact hole exposing the data pad.

11. A thin film transistor array comprising:
a substrate;
a gate line including a gate pad and disposed on the substrate;
a gate insulating layer disposed on the gate line and the gate pad;
a data line including a data pad and a drain electrode, the data pad and the drain electrode disposed on the gate insulating layer;
a first passivation layer disposed on the data line;
a first electrode disposed on the first passivation layer;
a second passivation layer disposed on the first electrode; and
a second electrode disposed on the second passivation layer, wherein the gate pad is exposed through a first contact hole, and
wherein the first contact hole extends through the gate insulating layer, the first passivation layer, and the second passivation layer.

12. The thin film transistor array of claim 11, wherein the drain electrode is connected to one of the first electrode and the second electrode through a second contact hole, wherein the second contact hole overlaps a portion of the gate line not overlapping the drain electrode, and wherein the portion of the gate line overlapping the second contact hole is covered by the gate insulating layer.

13. The thin film transistor array of claim 12, further comprising:
an organic layer disposed between the first passivation layer and the second passivation layer,
wherein the substrate has a display area displaying images and a peripheral area disposed near the display area,
wherein the organic layer is disposed in the display area, and
wherein the organic layer and the first passivation layer include at least a portion of the second contact hole.

14. The thin film transistor array of claim 13, wherein the first passivation layer and the second passivation layer include at least a portion of a third contact hole exposing the data pad.

15. A thin film transistor array comprising:
a substrate;
a gate line including a gate pad and disposed on the substrate;
a gate insulating layer disposed on the gate line and the gate pad;
a data line including a data pad and a drain electrode, the data pad and the drain electrode disposed on the gate insulating layer;
a first passivation layer disposed on the data line;
a first electrode disposed on the first passivation layer;
a second passivation layer disposed on the first electrode; and
a second electrode disposed on the second passivation layer,
wherein the drain electrode is exposed through a first contact hole, and
wherein the first contact hole overlaps a portion of the gate line not overlapping the drain electrode, and
wherein a portion of the gate line overlapping the first contact hole is covered by the gate insulating layer.

16. The thin film transistor array of claim 15, further comprising:
an organic layer disposed between the first passivation layer and the second passivation layer,
wherein the substrate has a display area displaying images and a peripheral area disposed near the display area,
wherein the organic layer is disposed in the display area, and
wherein the organic layer and the first passivation layer include at least a portion of the first contact hole.

17. The thin film transistor array of claim 16, wherein the gate pad is exposed through a second contact hole,
wherein the gate insulating layer, the first passivation layer, and the second passivation layer include at least a portion of the second contact hole,
wherein the first passivation layer and the second passivation layer include at least a portion of a third contact hole exposing the data pad.

* * * * *